US007250245B2

(12) United States Patent
West et al.

(10) Patent No.: US 7,250,245 B2
(45) Date of Patent: Jul. 31, 2007

(54) SWITCHABLE POLYMER PRINTING PLATES WITH CARBON BEARING IONIC AND STERIC STABILIZING GROUPS

(75) Inventors: Paul R. West, Fort Collins, CO (US); Jeffrey W. Leon, Rochester, NY (US); Nicki R. Miller, Ft. Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 65 days.

(21) Appl. No.: 10/852,552

(22) Filed: May 24, 2004

(65) Prior Publication Data

US 2005/0260509 A1 Nov. 24, 2005

(51) Int. Cl.
*G03F 7/004* (2006.01)
*G03F 7/30* (2006.01)

(52) U.S. Cl. ................ 430/270.1; 430/302; 430/271.1; 430/278.1; 430/303

(58) Field of Classification Search ............. 430/270.1, 430/302, 271.1, 278.1, 303
See application file for complete search history.

(56) References Cited

U.S. PATENT DOCUMENTS

| | | | |
|---|---|---|---|
| 3,706,706 A | 12/1972 | Vandenberg | |
| 5,339,737 A | 8/1994 | Lewis et al. | |
| 5,372,915 A | 12/1994 | Haley et al. | |
| 5,488,025 A | 1/1996 | Martin et al. | |
| 5,512,418 A | 4/1996 | Ma | |
| 5,554,739 A | 9/1996 | Belmont | |
| 5,713,287 A | 2/1998 | Gelbart | |
| 5,851,280 A | 12/1998 | Belmont et al. | |
| 5,985,514 A | 11/1999 | Zheng et al. | |
| 6,136,503 A | 10/2000 | Zheng et al. | |
| 6,146,812 A | 11/2000 | Leon et al. | |
| 6,190,830 B1 | 2/2001 | Leon et al. | |
| 6,190,831 B1 | 2/2001 | Leon et al. | |
| 6,218,073 B1 * | 4/2001 | Shimizu et al. | 430/273.1 |
| 6,242,155 B1 | 6/2001 | Yamasaki et al. | |
| 6,336,965 B1 | 1/2002 | Johnson et al. | |
| 6,399,268 B1 | 6/2002 | Fleming et al. | |
| 6,420,083 B1 | 7/2002 | Kawamura | |
| 6,447,978 B1 | 9/2002 | Leon et al. | |
| 6,451,500 B1 | 9/2002 | Leon | |
| 6,458,507 B1 | 10/2002 | Burberry et al. | |
| 6,478,863 B2 | 11/2002 | Johnson et al. | |
| 6,569,597 B2 | 5/2003 | Zheng | |
| 6,599,674 B1 | 7/2003 | Kawamura | |
| 6,610,458 B2 | 8/2003 | Miller et al. | |
| 6,623,908 B2 | 9/2003 | Zheng et al. | |
| 6,660,449 B2 | 12/2003 | Zheng et al. | |

OTHER PUBLICATIONS

"Glossary of Basic Terms in Polymer Science", published by International Union of Pure and Applied Chemistry (IUPAC), *Pure Appl. Chem.* 68, 2287-2311 (1996).

* cited by examiner

*Primary Examiner*—John S. Chu
(74) *Attorney, Agent, or Firm*—J. Lanny Tucker

(57) ABSTRACT

The present invention provides an imageable member having an imageable layer including a heat-sensitive ionomer characterized by a net positive or negative charge, and a photothermal conversion material. The photothermal conversion material includes carbonaceous particles having thereon both an organic moiety including an ionic substituent having like charge as the ionomer, and a group represented by the formula $$—X\text{-}[NIon]_p\text{-}R_{terminal};$$

wherein X represents an aromatic group or an alkyl group, NIon represents a non-ionic, non-ionizable group, $R_{terminal}$ represents hydrogen, an aromatic group, an alkoxy group, or an alkyl group, and p is an integer from 1 to about 500. The heat-sensitive ionomer and modified carbonaceous particles can be formulated in water or water-miscible solvents without agglomeration. Imageable members utilizing the modified carbonaceous particles as a photothermal conversion material exhibit acceptable optical density and exposure speed, and imaged members made therefrom exhibit excellent background performance.

68 Claims, No Drawings

SWITCHABLE POLYMER PRINTING PLATES WITH CARBON BEARING IONIC AND STERIC STABILIZING GROUPS

TECHNICAL FIELD

The present invention relates to thermally imageable compositions and imageable members including the thermally imageable compositions. The imageable composition includes a heat-sensitive ionomer and a photothermal conversion material. The photothermal conversion material includes carbonaceous particles having specialized surface functionality.

The art of lithographic printing is based upon the immiscibility of oil and water, wherein an oily material, such as an ink, is preferentially retained by an imaged area on the surface of a lithographic printing plate, and water or fountain solution is preferentially retained by non-imaged areas. When the surface of an imaged lithographic printing plate is moistened with water and ink is then applied, the background or non-imaged areas retain water and repel the ink, while the imaged areas accept the ink and repel the water. The ink is then transferred to the surface of a suitable printing medium, such as cloth, paper or metal, thereby reproducing an image.

Thermally sensitive printing plate precursors requiring wet processing after imaging are known. An example of such a precursor is described in U.S. Pat. No. 5,372,915 to Haley et al. The thermally sensitive precursors include an imageable layer comprising a mixture of dissolvable polymers and an infrared-absorbing compound.

Thermally switchable polymers have been described for use in an imageable material for a printing plate precursor. By “switchable,” it is meant that the polymer is rendered from hydrophobic or oleophilic to relatively more hydrophilic, or conversely, from hydrophilic to relatively more hydrophobic or oleophilic, upon exposure to heat. U.S. Pat. No. 5,512,418 to Ma, for instance, describes the use of heat-sensitive switchable polymers having pendant cationic quaternary ammonium groups. However, the materials described in this reference require wet processing after imaging.

Some known printing plate precursors utilizing thermally switchable polymers do not require wet processing. Avoiding the need for wet processing is advantageous in terms of processing time and material cost, and reduces the amount of chemical waste that is generated. U.S. Pat. No. 6,190,830 to Leon, et al. and U.S. Pat. No. 6,190,831 to Leon, et al., for example, describe imageable members that include an imageable layer containing a heat-sensitive polymer, and that do not require wet processing after imaging. The imageable layer is sensitized to infrared radiation by the incorporation of an infrared-absorbing photothermal conversion material such as an organic dye or a fine dispersion of carbon black. Upon exposure to a high-intensity infrared laser, light absorbed by the organic dye or carbon black is converted to heat, thereby promoting a chemical or physical change in the polymer. Suitable polymers include those that contain recurring units having organoammonium, organophosphonium, or organosulfonium groups, or those that contain recurring units having an N-alkylated aromatic heterocyclic group.

U.S. Pat. Nos. 5,985,514 and 6,136,503 to Zheng, et al. report an imaging member that includes an imageable layer containing a polymer comprising heat-activatable thiosulfate groups, and that does not require wet processing after imaging.

U.S. Pat. No. 6,447,978 to Leon, et al. reports an imaging member comprising a heat-sensitive polymer that contains recurring units including quaternary ammonium carboxylate groups. U.S. Pat. No. 6,451,500 to Leon reports an imaging member comprising a heat-sensitive polymer that contains recurring units including quaternary ammonium carboxylate groups that have at least one substituted alkylene ($C_1$-$C_3$) phenyl group. Such imageable members are also described in the corresponding International Publication WO 01/39985.

U.S. Pat. No. 6,569,597 to Zheng, et al. reports an imaging member comprising a thermally sensitive compound including a heat-activatable aromatic cyclic sulfonium zwitterion group.

Some of the heat-sensitive polymers described in the references identified above, particularly ionic polymers containing organoonium or other charged groups, have a tendency to undergo physical interactions or chemical reactions with an organic dye or carbon black that is present as a photothermal conversion material. The interactions can compromise the effectiveness of both the polymer and the photothermal conversion material. In particular, while carbon black is a photothermal conversion material of preference because of its low cost and absorption of light throughout the infrared region of the electromagnetic spectrum, its use also creates problems.

For example, ordinary carbon black cannot be readily dispersed in water or alcoholic solvents of choice. Special carbon black products that are designed to be water-dispersible (such as those modified to have special surface functionalities) may overcome this problem, but often agglomerate in the presence of polymers containing ionic groups due to chemical interactions.

Ionically stabilized carbon dispersions, for example, can provide printing plates having excellent background performance when used with switchable polymers. However, ionically stabilized carbon dispersions tend to flocculate in the highly ionic environment presented by polymers containing ionic groups (such as polymers having ammonium carboxylate functionality). When used in an imageable layer, low optical density and slow exposure speed is exhibited.

It would be desirable to have a heat-sensitive imageable member that includes a coating that is highly effective to convert radiation into heat and that can be coated out of water or other environmentally suitable solvents without agglomeration. One known approach is described in U.S. Pat. No. 6,399,268 to Fleming, et al. and the corresponding International Publication WO 00/63025. This approach utilizes a “polymer-grafted carbon” as a photothermal conversion material. The polymer-grafted carbon is a chemically modified carbon black in which a synthetic polymer or copolymer is covalently bonded to the surface of the carbon particles. Such modified carbon materials typically have improved dispersibility in specific solvents due to steric stabilization imparted by the polymeric grafts. Carbon particles covalently bonded to polymeric chains are sterically stabilized and resist flocculation even in the presence of ammonium carboxylate functionalized polymers, for instance. Plates prepared with such sterically stabilized carbon dispersions exhibit acceptable optical density and exposure speed, but tend to exhibit poor background sensitivity, even with the use of hydrophilic polymeric grafts such as poly(ethylene glycol).

SUMMARY OF THE INVENTION

In one embodiment, the present invention provides an imageable member having an imageable layer including a heat-switchable ionomer characterized by a net positive or negative charge, and a photothermal conversion material. The photothermal conversion material includes carbonaceous particles having thereon both an organic moiety including an ionic substituent having like charge as the ionomer, and a group represented by the formula $$\text{—X-[NIon]}_p\text{-R}_{terminal};$$

wherein X represents an aromatic group or an alkyl group, NIon represents a non-ionic, non-ionizable group, $R_{terminal}$ represents hydrogen, an aromatic group, an alkoxy group, or an alkyl group, and p is an integer from 1 to about 500.

Such modified carbonaceous particles have acceptable dispersibility in suitable solvents (e.g., water or water-miscible solvents such as alcohols) due to ionic stabilization, and resist flocculation and agglomeration due to steric stabilization even in the highly ionic environment presented by polymers containing ionic groups (such as polymers having ammonium carboxylate functionality). The modified carbonaceous particles can therefore be included as a photothermal conversion material in formulations for coating compositions with heat-sensitive or heat-switchable ionomers. The compositions can then be readily applied to a suitable support to provide an imageable member. The imageable member is thermally imageable and does not require post-imaging processing.

Imageable members utilizing the modified carbonaceous particles as a photothermal conversion material exhibit acceptable optical density and exposure speed, and imaged members made therefrom exhibit excellent background performance. The modified carbonaceous particles also provide an advantage of sensitization in that wavelength independence is achieved. That is, the photothermal conversion material provides for light absorption throughout the infrared region of the electromagnetic spectrum, and specifically over the wavelength range at which commercial thermal platesetters operate.

DETAILED DESCRIPTION OF THE INVENTION

An imageable member according to the invention generally comprises a support and an imageable layer on the support. In one embodiment, the present invention provides an imageable member having an imageable layer including a heat-sensitive ionomer characterized by a net positive or negative charge, and a photothermal conversion material. The photothermal conversion material includes carbonaceous particles having thereon both an organic moiety including an ionic or ionizable substituent having like charge as the ionomer, and a group represented by the formula $$\text{—X-[NIon]}_p\text{-R}_{terminal};$$

wherein X represents an aromatic group or an alkyl group, NIon represents a non-ionic, non-ionizable group, $R_{terminal}$ represents hydrogen, an aromatic group, an alkoxy group, or an alkyl group, and p is an integer from 1 to about 500. Carbonaceous particles meeting this description are referred to herein as "modified carbonaceous particles."

Each of the support, the heat-sensitive ionomer, and the photothermal conversion material are further described below.

Support

The imageable members of this invention comprise a support and one or more layers thereon that include a heat-sensitive composition. The support can be any self-supporting material including polymeric films, glass, ceramics, cellulosic materials (including papers), metals or stiff papers, or a lamination of any of these materials. The thickness of the support can be varied. Any substrate conventionally used for lithographic printing plates may be used. One suitable support is a polyester support prepared from, for example, polyethylene terephthalate or polyethylene naphthalate, and having a thickness of from about 100 to about 310 μm. Another suitable support is an aluminum sheet having a thickness of from about 100 to about 600 μm. The support should be fairly resistant to dimensional change under conditions of use.

The support may also be a cylindrical support that includes printing cylinders on press as well as printing sleeves that are fitted over printing cylinders. The use of such supports to provide cylindrical imageable members is described in U.S. Pat. No. 5,713,287 to Gelbart. The heat-sensitive composition can be coated or sprayed directly onto the cylindrical surface that is an integral part of the printing press.

The support may be treated as is conventional in the art of lithographic printing. For example, an aluminum support may be grained or anodized using conventional methods.

The support may be coated with one or more "subbing" layers to improve adhesion of the imageable layer. Examples of subbing layer materials include, but are not limited to, gelatin and other naturally occurring and synthetic hydrophilic colloids and vinyl polymers (such as vinylidene chloride copolymers) that are known for such purposes in the photographic industry, vinylphosphonic acid polymers, sol-gel materials such as those prepared from alkoxysilanes (including glycidoxypropyltriethoxysilane and aminopropyltriethoxysilane), epoxy functional polymers, and various ceramics.

The backside of the support may be coated with antistatic agents and/or slipping layers or matte layers to improve handling and "feel" of the imageable member.

Imageable Layer

The imageable member in many embodiments has only one layer on the support, that is, the heat-sensitive imageable layer. The imageable layer is prepared from a composition described herein, and includes a heat-sensitive ionomer and a specific photothermal conversion material (described below). In alternative embodiments, an additional photothermal conversion material can be included in a separate layer that is in thermal contact with the imageable layer.

In the heat-sensitive imageable layer of the imageable member, only the heat-sensitive ionomer and the photothermal conversion material are essential for imaging. The imageable layer can optionally include additional heat-sensitive ionomers, and may optionally contain a minor amount (up to about 50 wt.-%, but generally less than 20 wt.-%, based on total dry weight of the layer) of a binder or other polymeric materials that will not unacceptably degrade the imaging properties of the imageable layer. The imageable layer can also include one or more conventional surfactants for coatability or to enhance other properties, dyes or colorants to allow visualization of the written image, or any other additives commonly used in coatings for imageable elements in the lithographic arts.

The amount of heat-sensitive ionomer used in the imageable layer is suitably at least 0.1 $g/m^2$, and generally from about 0.1 to about 10 $g/m^2$ (based on the dry coating weight). This coating weight generally provides an average dry thickness in the range of about 0.1 to about 10 μm. (As described herein, any weight percentages or mass in reference to an ionomer includes the mass of the ionomer and the mass of any accompanying counterion.)

In the composition used to provide the imageable layer, the heat-sensitive ionomer is suitably present in an amount of at least 1 wt.-% (including solvent), and generally at least 2 wt.-%. A practical upper limit of the amount of charged polymer in the composition is about 20 to 25 wt.-%, depending on the coating method employed.

Heat-Sensitive Ionomer

The imageable layer includes a heat-sensitive ionomer. As used herein, the term "ionomer" refers to a macromolecule in which at least a small but significant portion of its constitutional units have ionizable or ionic groups, or both. For clarification of definitions for any terms relating to polymers or macromolecules, please refer to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The heat-sensitive ionomer employed in the present invention is generally a polymer bearing a charge and comprised of constitutional units, at least some of which include ionic groups. Most commonly, at least 10 mol-% of the constitutional units bear a negative or positive charge. More suitably, at least 20 mol-% of the constitutional units are charged. As described herein, the charge on a constitutional unit or the net charge on an ionomer is determined without taking into consideration any charge provided by a counterion that is not covalently bound to the constitutional unit or to the ionomer.

Polymers having a net negative charge and polymers having a net positive charge are suitable for use in the imageable layer. The heat-sensitive ionomer may include only constitutional units having a negative charge, or the heat-sensitive ionomer may include only constitutional units having a positive charge. In other embodiments, the heat-sensitive ionomer may include both negatively charged constitutional units and positively charged constitutional units. In some embodiments, the heat-sensitive ionomer includes constitutional units that have both a negative and a positive charge (i.e., having the characteristic of a "zwitterion"). In any event, the ionomer generally possesses a net overall charge that is either positive or negative.

In some embodiments, the heat-sensitive ionomer is a macromolecular polyelectrolyte. A macromolecular polyelectrolyte is an ionomer in which a substantial portion of the constitutional units have ionizable or ionic groups, or both. Typically at least 50 mol-% of the constitutional units are charged in a macromolecular polyelectrolyte. An even higher percentage (such as for example at least 60 mol-%, at least 70 mol-%, or at least 80 mol-%) of the constitutional units in a macromolecular polyelectrolyte may be charged.

The heat-sensitive ionomer is capable of undergoing a physical or chemical change upon heating. Generally, the heat-sensitive ionomer is hydrophilic before heating, due to the presence of the charged constitutional units. Upon thermal imaging, the ionomer undergoes a physical or chemical change that renders the exposed (imaged) areas of the layer more hydrophobic or more oleophilic in nature. The unexposed areas remain hydrophilic. The physical or chemical change in the exposed areas may include a reduction in the net absolute charge of the ionomer, for example. Such heat-sensitive ionomers are sometimes termed "switchable" in the art.

Several broad classes of polymers suitable as the heat-sensitive ionomer in the practice of this invention have been identified:

I) crosslinked or uncrosslinked vinyl polymers comprising constitutional units having positively-charged, pendant N-alkylated aromatic heterocyclic groups;

II) crosslinked or uncrosslinked polymers comprising constitutional organoonium groups;

III) polymers comprising a pendant thiosulfate ("Bunte salt") group;

IV) anionic polymers comprising constitutional units having carboxylate groups linked to the polymeric backbone.

Each class of polymer identified above is described in turn below. The imageable layer can include mixtures of polymers from one class, or a mixture of one or more polymers from two or more classes. These classifications should be seen only as non-limiting examples, and the present invention is not limited to only the types of ionomers set forth. Any heat-sensitive ionomer meeting the criteria set forth above may be employed in the practice of the invention, as will be recognized by those skilled in the art. By way of example only, suitable polymers may also be described in U.S. Pat. No. 6,242,155 to Yamasaki, et al. and in U.S. Pat. No. 6,420,083 to Kawamura, each of which is incorporated by reference in its entirety.

Class I Polymers:

Class I polymers and methods of making such polymers are thoroughly described in U.S. Pat. No. 6,190,831 to Leon, et al. and U.S. Pat. No. 6,399,268 to Fleming, et al. and in the corresponding International Publication WO 00/63025 of Fleming, et al., each of which is incorporated by reference in its entirety.

Class I polymers are crosslinked or uncrosslinked vinyl polymers comprising constitutional units having positively-charged, pendant N-alkylated aromatic heterocyclic groups. Suitable Class I polymers generally have a molecular weight of at least 1000 Da and can be any of a wide variety of hydrophilic vinyl homopolymers and copolymers having positively-charged groups. They may be prepared from ethylenically unsaturated polymerizable monomers using any conventional polymerization technique. Most often, the polymers are copolymers prepared from two or more ethylenically unsaturated polymerizable monomers, at least one of which contains the desired pendant positively-charged group, and another monomer that is capable of providing other properties, such as crosslinking sites and possibly adhesion to the support. Procedures and reactants needed to prepare these polymers are well-known.

The presence of a cationic group apparently provides or facilitates the "switching" of the imageable layer from hydrophilic to hydrophobic or oleophilic in the areas that have been exposed to heat in some manner, when the cationic group reacts with its counterion. The result is the loss of net charge.

Such a switching reaction is more easily accomplished when the counteranion is more nucleophilic and/or more basic. For example, an acetate anion is typically more reactive than a chloride anion. By varying the chemical nature of the counteranion, the reactivity of the heat-sensitive ionomer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate and others readily apparent to one skilled in the art.

An aromatic cationic group is present in a sufficient proportion of constitutional units of the polymer so that the polymer is initially hydrophilic, and so that the heat-activated reaction described above can provide desired hydrophobicity or oleophilicity of the imaged printing layer. The groups can be attached along a principal backbone of the polymer, or to one or more branches of a polymeric network, or both. The aromatic cationic groups generally comprise 5 to 10 carbon, nitrogen, sulfur or oxygen atoms in the ring (at least one being a positively-charged nitrogen atom), to which is attached a branched or unbranched, substituted or unsubstituted alkyl group.

Thus, the polymer containing the aromatic heterocyclic group can be represented by the Structure I:

I

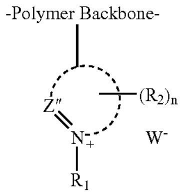

In this structure, $R_1$ is a branched or unbranched, substituted or unsubstituted alkyl group having from 1 to 12 carbon atoms (such as methyl, ethyl, n-propyl, isopropyl, t-butyl, hexyl, methoxymethyl, benzyl, neopentyl and dodecyl). Preferably, $R_1$ is a substituted or unsubstituted, branched or unbranched alkyl group having from 1 to 6 carbon atoms, and most preferably, it is a substituted or unsubstituted methyl group.

$R_2$ can be a substituted or unsubstituted alkyl group (as defined above, and additionally a cyanoalkyl group, a hydroxyalkyl group or alkoxyalkyl group), substituted or unsubstituted alkoxy having 1 to 6 carbon atoms (such as methoxy, ethoxy, isopropoxy, oxymethylmethoxy, n-propoxy and butoxy), a substituted or unsubstituted aryl group having 6 to 14 carbon atoms in the ring (such as phenyl, naphthyl, anthryl, p-methoxyphenyl, xylyl, and alkoxycarbonylphenyl), halo (such as chloro and bromo), a substituted or unsubstituted cycloalkyl group having 5 to 8 carbon atoms in the ring (such as cyclopentyl, cyclohexyl and 4-methylcyclohexyl), or a substituted or unsubstituted heterocyclic group having 5 to 8 atoms in the ring including at least one nitrogen, sulfur or oxygen atom in the ring (such as pyridyl, pyridinyl, tetrahydrofuranyl and tetrahydropyranyl). Preferably, $R_2$ is substituted or unsubstituted methyl or ethyl group.

Z" represents carbon atoms and any additional nitrogen, oxygen, or sulfur atoms necessary to complete the 5- to 10-membered aromatic N-heterocyclic ring that is attached to the polymeric backbone. Thus, the ring can include two or more nitrogen atoms in the ring (for example, N-alkylated diazinium or imidazolium groups), or N-alkylated nitrogen-containing fused ring systems including, but not limited to, pyridinium, quinolinium, isoquinolinium acridinium, phenanthradinium and others readily apparent to one skilled in the art.

$W^-$ is a suitable anion as described above. Most commonly it is acetate or chloride. $W^-$ is not limited to monovalent anions, but may include a polyvalent anion.

Also in Structure I, n is 0 to 6, and is preferably 0 or 1. Most commonly, n is 0.

The aromatic heterocyclic ring can be attached to the polymeric backbone at any position on the ring. Preferably, there are 5 or 6 atoms in the ring, one or two of which are nitrogen. Thus, the N-alkylated nitrogen containing aromatic group is preferably imidazolium or pyridinium and most preferably it is imidazolium.

The constitutional units containing the cationic aromatic heterocycle can be provided by reacting a precursor polymer containing unalkylated nitrogen containing heterocyclic units with an appropriate alkylating agent (such as alkyl sulfonate esters, alkyl halides and other materials readily apparent to one skilled in the art) using known procedures and conditions.

Preferred Class I polymers can be represented by the following Structure II:

II

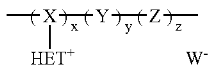

wherein X represents constitutional units to which the N-alkylated nitrogen containing aromatic heterocyclic groups (represented by $HET^+$) are attached, Y represents constitutional units derived from ethylenically unsaturated polymerizable monomers that may provide active sites for crosslinking using any of various crosslinking mechanisms (described below), and Z represents constitutional units derived from any additional ethylenically unsaturated polymerizable monomers. The various repeating units are present in suitable amounts, as represented by x being from about 15 to 100 mol-%, y being from about 0 to about 20 mol-%, and z being from 0 to 85 mol-%. Preferably, x is from about 30 to about 98 mol-%, y is from about 2 to about 10 mol-% and z is from 0 to about 68 mol-%. $W^-$ is a suitable anion as described above. Most commonly it is acetate or chloride. $W^-$ is not limited to monovalent anions, but may include a polyvalent anion.

In some embodiments, the polymer may be a crosslinked vinylic polymer. Crosslinking of the polymers can be provided in a number of ways. There are numerous monomers and methods for crosslinking that are familiar to one skilled in the art. Some representative crosslinking strategies include, but are not necessarily limited to:

a) reacting Lewis basic units (such as carboxylic acid, carboxylate, amine and thiol units) within the polymer with a multifunctional epoxide-containing crosslinker or resin;

b) reacting an epoxide units within the polymer with multifunctional amines, carboxylic acids, or other multifunctional Lewis basic unit;

c) irradiative or radical-initiated crosslinking of double bond-containing units such as acrylates, methacrylates, cinnamates, or vinyl groups;

d) reacting a multivalent metal salts with ligating groups within the polymer (the reaction of zinc salts with carboxylic acid-containing polymers is an example);

e) using crosslinkable monomers that react via the Knoevenagel condensation reaction, such as (2-acetoacetoxy) ethyl acrylate and methacrylate;

f) reacting an amine, thiol, or carboxylic acid groups with a divinyl compound (such as bis (vinylsulfonyl) methane) via a Michael addition reaction;

g) reacting a carboxylic acid units with crosslinkers having multiple aziridine or oxazoline units;

h) reacting crosslinkers having multiple isocyanate units with amines, thiols, or alcohols within the polymer;

i) mechanisms involving the formation of interchain sol-gel linkages (such as the use of the 3-(trimethoxysilyl) propylmethacrylate monomer);

j) oxidative crosslinking using an added radical initiator (such as a peroxide or hydroperoxide);

k) autooxidative crosslinking, such as employed by alkyd resins;

l) sulfur vulcanization; and m) processes involving ionizing radiation.

Monomers having crosslinkable groups or active crosslinkable sites (or groups that can serve as attachment points for crosslinking additives, such as epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Additional monomers that provide the repeating units represented by Z in Structure II above include any useful hydrophilic or oleophilic ethylenically unsaturated polymerizable monomer that may provide desired physical or printing properties to the hydrophilic imageable layer. Such monomers include, but are not limited to, acrylates, methacrylates, isoprene, acrylonitrile, styrene and styrene derivatives, acrylamides, methacrylamides, acrylic or methacrylic acid and vinyl halides.

Class II Polymers

Class II polymers and methods of making such polymers are thoroughly described in U.S. Pat. No. 6,190,830 to Leon, et al. and U.S. Pat. No. 6,399,268 to Fleming, et al. and in the corresponding International Publication WO 00/63025 of Fleming, et al., each of which is incorporated by reference in its entirety.

Class II polymers are crosslinked or uncrosslinked polymers comprising constitutional units including an organoonium moiety. Suitable Class II polymers generally have a molecular weight of at least 1000 Da. They can be any of a wide variety of vinyl or non-vinyl homopolymers and copolymers.

Non-vinyl polymers of Class II include, but are not limited to, polyesters, polyamides, polyamide-esters, polyarylene oxides and derivatives thereof, polyurethanes, polyxylylenes and derivatives thereof, silicon-based sol-gels (solsesquioxanes), polyamidoamines, polyimides, polysulfones, polysiloxanes, polyethers, poly(ether ketones), poly (phenylene sulfide) ionomers, polysulfides and polybenzimidazoles. Preferably, such non-vinyl polymers are silicon based sol-gels, polyarylene oxides, poly(phenylene sulfide) ionomers or polyxylylenes, and most preferably, they are poly(phenylene sulfide) ionomers. Procedures and reactants needed to prepare all of these types of polymers are well-known.

Silicon-based sol-gels useful in this invention can be prepared as a crosslinked polymeric matrix containing a silicon colloid derived from di-, tri- or tetraalkoxy silanes. A preferred sol-gel uses N-trimethoxysilylpropyl-N,N,N-trimethylammonium acetate both as a crosslinking agent and as the polymer layer forming material.

The presence of an organoonium moiety that is chemically incorporated into the polymer in some fashion apparently provides or facilitates the "switching" of the imageable layer from hydrophilic to oleophilic in the exposed areas upon exposure to energy that provides or generates heat, when the cationic moiety reacts with its counterion. The net result is the loss of charge. Such reactions are more easily accomplished when the anion of the organoonium moiety is more nucleophilic and/or more basic, as described above for the Class I polymers.

The organoonium moiety within the polymer can be chosen from a trisubstituted sulfur moiety (organosulfonium), a tetrasubstituted nitrogen moiety (organoammonium), or a tetrasubstituted phosphorous moiety (organophosphonium). The organoonium moiety can be chemically attached to (that is, pendant) the polymer backbone, or incorporated within the backbone in some fashion. In either embodiment, the organoonium moiety is present in sufficient repeating units of the polymer (at least 15 mol-%) to provide hydrophilicity to the polymer, and so that the heat-activated reaction described above can occur to provide desired hydrophobicity or oleophilicity to the imaged areas.

When chemically attached as a pendant group, the organoonium moiety can be attached along a principal backbone of the polymer, or to one or more branches of a polymeric network, or both. When chemically incorporated within the polymer backbone, the moiety can be present in either cyclic or acyclic form, and can also form a branching point in a polymer network. For an example of an organoonium moiety incorporated into the polymer backbone, reference can be made to U.S. Pat. No. 6,569,597 to Zheng, et al. which reports a switchable polymer comprising a cyclic sulfonium zwitterion moiety.

Most commonly, the organoonium moiety is provided as a pendant group along the polymeric backbone. Pendant organoonium moieties can be chemically attached to the polymer backbone after polymer formation, or functional groups on the polymer can be converted to organoonium moieties using known chemistry. For example, pendant quaternary ammonium groups can be provided on a polymeric backbone by the displacement of a "leaving group" functionality (such as a halogen) by a tertiary amine nucleophile. Alternatively, the organoonium group can be present on a monomer that is then polymerized, or derived by the alkylation of a neutral heteroatom unit (trivalent nitrogen or phosphorous group or divalent sulfur group) already incorporated within the polymer.

The organoonium moiety is substituted to provide a positive charge. Each substituent generally has at least one carbon atom that is directly attached to the sulfur, nitrogen or phosphorus atom of the organoonium moiety. Useful substituents include, but are not limited to, substituted or unsubstituted alkyl groups having 1 to 12 carbon atoms and preferably from 1 to 7 carbon atoms (such as methyl, ethyl, n-propyl, isopropyl, t-butyl, hexyl, methoxyethyl, isopropoxymethyl, substituted or unsubstituted aryl groups (phenyl, naphthyl, p-methylphenyl, m-methoxyphenyl, p-chlorophenyl, p-methylthiophenyl, p-N,N-dimethylaminophenyl, xylyl, methoxycarbonylphenyl and cyanophenyl), and substituted or unsubstituted cycloalkyl groups having 5 to 8 carbon atoms in the carbocyclic ring (such as cyclopentyl, cyclohexyl, 4-methylcyclohexyl and 3-methylcyclohexyl). Other useful substituents would be readily apparent to one skilled in the art, and any combination of the expressly described substituents is also contemplated.

The organoonium moieties include any suitable counter-anion as described above for the Class I polymers.

In addition, vinylic Class II polymers can be used in the practice of this invention. Like the non-vinyl polymers, such heat-sensitive polymers are composed of constitutional units having one or more types of organoonium group. For example, such a polymer can have constitutional units with both organoammonium groups and organosulfonium groups. It is also not necessary that all of the organoonium groups have the same alkyl substituents. For example, a polymer can have constitutional units having more than one type of organoammonium group. Useful anions in these polymers are the same as those described above for the non-vinyl polymers.

The organoonium moiety is present in sufficient repeating units of the polymer (at least 15 mol-%) to provide hydrophilicity to the polymer, and so that the heat-activated reaction described above can occur to provide desired hydrophobicity or oleophilicity to the imaged areas. The group can be attached along a principal backbone of the polymer, or to one or more branches of a polymeric network, or both. Pendant groups can be chemically attached to the polymer backbone after polymer formation using known chemistry. For example, pendant organoammonium, organophosphonium or organosulfonium groups can be provided on a polymeric backbone by the nucleophilic displacement of a pendant leaving group (such as a halide or sulfonate ester) on the polymeric chain by a trivalent amine, divalent sulfur or trivalent phosphorous nucleophile. Pendant onium groups can also be provided by alkylation of corresponding pendant neutral heteroatom groups (nitrogen, sulfur or phosphorous) using any commonly used alkylating agent such as alkyl sulfonate esters or alkyl halides. Alternatively a monomer precursor containing the desired organoammonium, organophosphonium or organosulfonium group may be polymerized to yield the desired polymer.

The organoammonium, organophosphonium or organosulfonium group in the vinyl polymer provides the desired positive charge. Generally, suitable pendant organoonium groups can be illustrated by the following Structures III, IV and V:

III

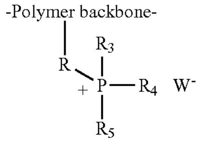

IV

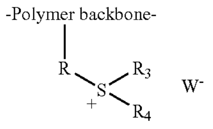

V

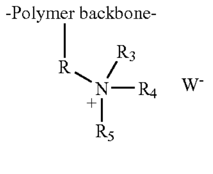

wherein R is a substituted or unsubstituted alkylene group having 1 to 12 carbon atoms that can also include one or more oxy, thio, carbonyl, amido or alkoxycarbonyl groups with the chain (such as methylene, ethylene, isopropylene, methylenephenylene, methyleneoxymethylene, n-butylene and hexylene), a substituted or unsubstituted arylene group having 6 to 10 carbon atoms in the ring (such as phenylene, naphthylene, xylylene and 3-methoxyphenylene), or a substituted or unsubstituted cycloalkylene group having 5 to 10 carbon atoms in the ring (such as 1,4-cyclohexylene, and 3-methyl-1,4-cyclohexylene). In addition, R can be a combination of two or more of the defined substituted or unsubstituted alkylene, arylene and cycloalkylene groups. Preferably, R is a substituted or unsubstituted ethyleneoxycarbonyl or phenylenemethylene group. Other useful substituents not listed herein could include combinations of any of those groups listed above as would be readily apparent to one skilled in the art.

$R_3$, $R_4$ and $R_5$ are independently substituted or unsubstituted alkyl group having 1 to 12 carbon atoms (such as methyl, ethyl, n-propyl, isopropyl, t-butyl, hexyl, hydroxymethyl, methoxymethyl, benzyl, methylenecarboalkoxy and a cyanoalkyl), a substituted or unsubstituted aryl group having 6 to 10 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl), or a substituted or unsubstituted cycloalkyl group having 5 to 10 carbon atoms in the carbocyclic ring (such as 1,3- or 1,4-cyclohexyl). Alternatively, any two of $R_3$, $R_4$ and $R_5$ can be combined to form a substituted or unsubstituted heterocyclic ring with the charged phosphorus, sulfur or nitrogen atom, the ring having 4 to 8 carbon, nitrogen, phosphorus, sulfur or oxygen atoms in the ring. Such heterocyclic rings include, but are not limited to, substituted or unsubstituted morpholinium, piperidinium and pyrrolidinium groups for Structure V. Other useful substituents for these various groups would be readily apparent to one skilled in the art, and any combinations of the expressly described substituents are also contemplated.

Preferably, $R_3$, $R_4$ and $R_5$ are independently substituted or unsubstituted methyl or ethyl groups.

$W^-$ is any suitable anion as described above for the Class I polymers. Acetate and chloride are the most commonly employed anions. $W^-$ is not limited to monovalent anions, but may include a polyvalent anion.

In preferred embodiments, the vinyl Class II polymers useful in the practice of this invention can be represented by the following Structure VI:

VI

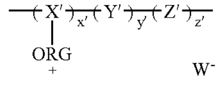

wherein X' represents constitutional units to which the organoonium groups ("ORG") are attached, Y' represents constitutional units derived from ethylenically unsaturated polymerizable monomers that may provide active sites for crosslinking using any of various crosslinking mechanisms (described below), and Z' represents constitutional units derived from any additional ethylenically unsaturated polymerizable monomers. The various constitutional units are present in suitable amounts, as represented by x' being from about 15 to about 99 mol-%, y' being from about 1 to about 20 mol-%, and z' being from 0 to about 84 mol-%. Preferably, x' is from about 30 to about 98 mol-%, y' is from about 2 to about 10 mol-% and z' is from 0 to about 68 mol-%. $W^-$ is a suitable anion as described above. Most commonly it is acetate or chloride. $W^-$ is not limited to monovalent anions, but may include a polyvalent anion.

Crosslinking of the vinyl polymer can be achieved in the same way as described above for the Class I polymers.

Additional monomers that provide the additional constitutional units represented by Z' in Structure VI include any useful hydrophilic or oleophilic ethylenically unsaturated polymerizable monomer that may provide desired physical or printing properties to the imageable layer. Such monomers include, but are not limited to, acrylates, methacrylates, acrylonitrile, isoprene, styrene and styrene derivatives, acrylamides, methacrylamides, acrylic or methacrylic acid and vinyl halides.

Class III Polymers

Class III polymers and methods of making such polymers are thoroughly described in U.S. Pat. Nos. 5,985,514 and 6,136,503 to Zheng, et al., U.S. Pat. No. 6,399,268 to Fleming, et al. and in the corresponding International Publication WO 00/63025 of Fleming, et al., each of which is incorporated by reference in its entirety.

Class III polymers are polymers comprising a pendant thiosulfate ("Bunte salt") group. Suitable Class III polymers have a molecular weight of at least 1000 Da, and more suitably, of at least 5000 Da. By way of example, the polymers can be vinyl homopolymers or copolymers prepared from one or more ethylenically unsaturated polymerizable monomers that are reacted together using known polymerization techniques and reactants. Alternatively, they can be addition-type homopolymers or copolymers (such as polyethers) prepared from one or more heterocyclic monomers that are reacted together using known polymerization techniques and reactants. Additionally, they can be condensation-type polymers (such as polyesters, polyimides, polyamides or polyurethanes) prepared using known polymerization techniques and reactants. Whatever the type of polymers, at least 15 mol-% (generally at least 20 mol-%, and more commonly at least 30 mol-%) of the total constitutional units in the polymer comprise heat-activatable thiosulfate groups.

The Class III polymers useful in the practice of this invention can be represented by the Structure VII wherein the thiosulfate group (or "Bunte salt") is a pendant group:

VII

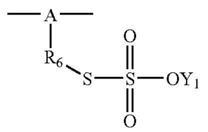

wherein A represents a polymeric backbone, $R_6$ is a divalent linking group, and $Y_1$ is hydrogen or a cation.

Useful polymeric backbones include, but are not limited to, vinyl polymers, polyethers, polyimides, polyamides, polyurethanes and polyesters. Most commonly, the polymeric backbone is a vinyl polymer or polyether.

Useful $R_6$ linking groups in Structure VII include $-(COO)_n(Z_1)_m-$ wherein n is 0 or 1, m is 0 or 1, and $Z_1$ is a substituted or unsubstituted alkylene group having 1 to 6 carbon atoms (such as methylene, ethylene, n-propylene, isopropylene, butylenes, 2-hydroxypropylene and 2-hydroxy-4-azahexylene) that can have one or more oxygen, nitrogen or sulfur atoms in the chain, a substituted or unsubstituted arylene group having 6 to 14 carbon atoms in the aromatic ring (such as phenylene, naphthalene, anthracylene and xylylene), or a substituted or unsubstituted arylenealkylene (or alkylenearylene) group having 7 to 20 carbon atoms in the chain (such as p-methylenephenylene, phenylenemethylene-phenylene, biphenylene and phenyleneisopropylenephenylene). In addition, $R_6$ can be an alkylene group, an arylene group, in an arylenealkylene group as defined above for $Z_1$.

Preferably, $R_6$ is an alkylene group of 1 to 3 carbon atoms, an arylene group of 6 carbon atoms in the aromatic ring, an arylenealkylene group of 7 or 8 carbon atoms in the chain, or $-COO(Z_1)_m-$ wherein $Z_1$ is methylene, ethylene or phenylene. Most preferably, $R_6$ is phenylene, methylene or $-COO-$.

$Y_1$ is hydrogen, ammonium ion, or a metal ion (such as sodium, potassium, magnesium, calcium, cesium, barium, zinc or lithium ion). Most commonly, $Y_1$ is hydrogen, sodium ion or potassium ion.

As the thiosulfate group is generally pendant to the backbone, it generally derives from an ethylenically unsaturated polymerizable monomer that can be polymerized using conventional techniques to form vinyl homopolymers of the thiosulfate-containing constitutional units, or vinyl copolymers when copolymerized with one or more additional ethylenically unsaturated polymerizable monomers. The thiosulfate-containing constitutional units suitably comprise at least 15 mol-% of all constitutional units in the polymer; generally they comprise from about 20 to 100 mol-% of all constitutional units. A polymer can include more than one type of repeating unit containing a thiosulfate group as described herein.

Polymers having the above-described thiosulfate group are believed to crosslink and to switch from hydrophilic thiosulfate to hydrophobic disulfide (upon loss of sulfate) upon heating.

Thiosulfate-containing molecules (or "Bunte salts") can be prepared by a reaction between an alkyl halide and thiosulfate salt as taught by Bunte, *Chem. Ber.* 7, 646 (1884). Polymers containing thiosulfate groups can either be prepared from functional monomers or from preformed polymers. Polymers can be prepared from preformed polymers in a similar manner as described in U.S. Pat. No. 3,706,706 to Vandenberg. Thiosulfate-containing molecules can also be prepared by reaction of an alkyl epoxide with a thiosulfate salt, or between an alkyl epoxide and a molecule containing a thiosulfate moiety (such as 2-aminoethanethiosulfuric acid), and the reaction can be performed either on a monomer or polymer.

Vinyl polymers can be prepared by copolymerizing monomers containing the thiosulfate functional groups with one or more other ethylenically unsaturated polymerizable monomers to modify polymer chemical or functional properties, to optimize imageable member performance, or to introduce additional crosslinking capability.

Useful additional ethylenically unsaturated polymerizable monomers include, but are not limited to, acrylates (including methacrylates) such as ethyl acrylate, n-butyl acrylate, methyl methacrylate and t-butyl methacrylate, acrylamides (including methacrylamides), an acrylonitrile (including methacrylonitrile), vinyl ethers, styrenes, vinyl acetate, dienes (such as ethylene, propylene, 1,3-butadiene and isobutylene), vinyl pyridine and vinylpyrrolidone. Acrylamides, acrylates and styrenes are most commonly employed.

Class IV Polymers

Class IV polymers and methods of making such polymers are thoroughly described in U.S. Pat. No. 6,447,978 to Leon, et al. and U.S. Pat. No. 6,451,500 to Leon, and in the corresponding International Publication WO 01/39985 of Leon, et al., each of which is incorporated by reference in its entirety. Certain polymers described in U.S. Pat. No. 6,242,155 to Yamasaki, et al. and in U.S. Pat. No. 6,420,083 to Kawamura may also be employed.

Class IV polymers include anionic polymers having a backbone and including constitutional units having carboxylate groups linked directly or indirectly to the polymer backbone. The polymers generally have a molecular weight of at least 3,000 Da and more suitably of at least 20,000 Da.

A polymer of Class IV comprises constitutional units at least some of which include anionic carboxylate groups, and which may be randomly dispersed throughout the polymer. The polymer may be chosen or derived from a variety of polymers and copolymer classes including, but not necessarily limited to polyamic acids, polyesters, polyamides, polyurethanes, silicones, proteins (such as modified gelatins), polypeptides, and polymers and copolymers based on ethylenically unsaturated polymerizable monomers such as acrylates, methacrylates, acrylamides, methacrylamides, vinyl ethers, vinyl esters, alkyl vinyl ethers, maleic acid/anhydride, itaconic acid/anhydride, styrenics, acrylonitrile, and olefins such as butadiene, isoprene, propylene, and ethylene. A carboxylate-containing polymer may be derived from more than one type of carboxylic acid-containing or carboxylate-containing monomer. Certain monomers, such as maleic acid/anhydride and itaconic acid/anhydride may contain more than one carboxylic acid or carboxylate unit. Most commonly, the polymer is an addition polymer or copolymer derived from acrylic acid, methacrylic acid, maleic acid or anhydride, or itaconic acid or anhydride, or a conjugate base or hydrolysis product of any of the foregoing.

The polymer may include one or more types of carboxylate-containing constitutional units (or equivalent anhydride units) identified as $A_1$ in Structure VIII, and optionally one or more non-carboxylated constitutional units denoted as $B_1$ in Structure VIII.

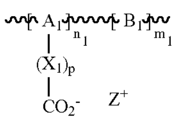

VIII

The carboxylate-containing constitutional units are linked directly to the polymer backbone (i.e., p=0) which is derived from the Al monomers, or are connected indirectly to the backbone (i.e., p=1) by spacer units identified as $X_1$ in Structure VIII.

The optional spacer unit $X_1$ can be any divalent aliphatic, alicyclic or aromatic group that does not adversely affect the polymer's heat-sensitivity. For example, $X_1$ can be a substituted or unsubstituted alkylene group having 1 to 16 carbon atoms (such as methylene, ethylene, isopropylene, n-propylene and n-butylene), a substituted or unsubstituted arylene group having 6 to 10 carbon atoms in the arylene ring (such as m- or p-phenylene and naphthylenes), substituted or unsubstituted combinations of alkylene and arylene groups (such arylenealkylene, arylenealkylenearylene and alkylenearylenealkylene groups), and substituted or unsubstituted N-containing heterocyclic groups. Any of these defined groups can be connected in a chain with one or more amino, carbonamido, oxy, thio, amido, oxycarbonyl, aminocarbonyl, alkoxycarbonyl, alkanoyloxy, alkanoylamino or alkaminocarbonyl groups. Particularly useful spacer groups contain an ester or amide connected to an alkylene group or arylene group (as defined above), such as when the ester and amide groups are directed bonded to $A_1$.

Additional monomers (non-carboxylate monomers) that provide the constitutional units represented by $B_1$ in Structure VIII above include any useful hydrophilic or oleophilic ethylenically unsaturated polymerizable comonomers that may provide desired physical or printing properties of the surface imaging layer or which provide crosslinkable functionalities. One or more monomers may be used to provide these constitutional $B_1$ units, including but not limited to, acrylates, methacrylates, styrene and its derivatives, acrylamides, methacrylamides, olefins, vinyl halides, vinyl ethers, and any monomers (or precursor monomers) that contain carboxy groups.

In Structure VIII, $n_1$ represents about 25 to 100 mol-% (more commonly from about 50 to 100 mol-%), and $m_1$ represents 0 to about 75 mol-% (more commonly from 0 to about 50 mol-%).

While Structure VIII could be interpreted to show polymers derived from only two ethylenically unsaturated polymerizable monomers, it is intended to include terpolymers and other polymers derived from more than two monomers, which are also suitable in the practice of the invention.

In Structure VIII, $Z^+$ represents a countercation. $Z^+$ is not restricted to monovalent cations; polyvalent countercations are suitable as well.

In one suitable embodiment, the ionomer comprises a quaternary ammonium counterion. The quaternary ammonium counterion may include a substituted or unsubstituted phenyl moiety bonded directly or via a ($C_1$-$C_3$) alkylene to a quaternary nitrogen.

The quaternary ammonium counterions are suitably present in the heat-sensitive ionomer in such a quantity as to provide a minimum of one mole of the quaternary ammonium counterions per 1000 g of polymer, and a maximum of one mole of quaternary ammonium counterions per 45 g of polymer. Suitably, this ratio (moles of quaternary ammonium counterions to grams of polymer) is from about 1:500 to about 1:45 and more commonly, this ratio is from about 1:300 to about 1:45. This ratio is readily determined from a knowledge of the molecular formula of a given polymer (and the monomeric starting materials) or standard titrimetric or spectrometric methods.

Although it may be desirable that all of the carboxylic acid, latent carboxylic acid (i.e., anhydride) and carboxylate functionalities of the polymer are present as the desired quaternary ammonium salt, imaging compositions in which the polymer is incompletely converted may still retain satisfactory imageability. Most commonly, at least 50% of the constitutional units such as $A_1$ comprise an associated quaternary ammonium counterion.

The quaternary ammonium counterion may be any ammonium ion in which the nitrogen is covalently bound to a total of four alkyl or aryl substituents $R_1$ through $R_4$ as defined below. Most suitably, at least one of the four substituents is a substituted alkylene ($C_1$-$C_3$) phenyl group, as described below. Alternatively, multi-cationic species containing more than one quaternary nitrogen and having charges greater than +1 (for example +2 for diammonium ions, and +3 for triammonium ions) may be used as the quaternary ammonium countercation.

More particularly, $R_1$, $R_2$ and $R_3$ and optionally $R_4$ are independently substituted or unsubstituted alkyl groups having 1 to 12 carbon atoms (such as methyl, ethyl, n-propyl, isopropyl, 1-butyl, hexyl, methoxy, trichloromethyl, hydroxyethyl, 2-propanonyl, ethoxycarbonylmethyl, benzyl, substituted benzyl (such as 4-methoxybenzyl, o-bromobenzyl, and p-trifluoromethylbenzyl), and cyanoalkyl), or substituted or unsubstituted aryl groups having 6 to 14 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl). Alternatively, any two or all three of $R_1$, $R_2$ and $R_3$ can be combined to form a ring (or two rings for four substituents) with the quaternary nitrogen atom, the ring having 5 to 14 carbon, oxygen, sulfur and nitrogen atoms in the ring. Such rings include, but are not limited to, morpholine, piperidine, pyrrolidine, carbazole, indoline and isoindoline rings. The nitrogen atom can also be located at the tertiary position of a fused ring. Other useful substituents for these various groups would be readily apparent to one skilled in the art, and any combinations of the expressly described substituents are also contemplated.

Preferably, $R_1$, $R_2$ and $R_3$ are independently linear or branched unsubstituted alkyl groups of 1 to 3 carbon atoms, or linear or branched hydroxyalkyl groups of 1 to 3 carbon atoms that comprise 1 to 3 hydroxy groups as the only substituents (generally only one hydroxy group per carbon atom). More preferably, these radicals are independently methyl, hydroxymethyl, ethyl, 2-hydroxyethyl, 1-hydroxyethyl or 1,2-dihydroxyethyl and most preferably, they are either methyl or 2-hydroxyethyl.

In one embodiment, $R_4$ is a substituted alkylenephenyl group that has at least one substituent on either the alkylene or phenyl moiety of the group. More preferably, the one or more substituents are on the phenyl moiety. The phenyl moiety of $R_4$ can have from 1 to 5 substituents in any useful substitution pattern. Useful substituents include but are not limited to, halo groups (such as fluoro, chloro, bromo, and iodo), substituted or unsubstituted alkyl groups having from 1 to 12 carbon atoms (such as methyl, ethyl, isopropyl, t-butyl, n-pentyl and n-propyl) that can be further substituted with any of the substituents listed herein (such as haloalkyl groups including trihalomethyl groups), substituted or unsubstituted alkoxy groups having 1 to 12 carbon atoms (such as methoxy, ethoxy, isopropoxy, n-pentoxy and n-propoxy), cyano, nitro, substituted or unsubstituted aryl groups having 6 to 14 carbon atoms in the aromatic carbocyclic ring (as defined above for $R_1$, $R_2$ and $R_3$), substituted or unsubstituted alkyleneoxycarbonyl groups having 2 to 12 carbon atoms (such as methyleneoxycarbonyl, ethyleneoxycarbonyl and isopropyleneoxycarbonyl), substituted or unsubstituted alkylcarbonyloxy groups having 2 to 12 carbon atoms (such as methylenecarbonyloxy, ethylenecarbonyloxy and isopropylenecarbonyloxy), substituted or unsubstituted alkylcarbonyl groups having 2 to 12 carbon atoms (such as methylenecarbonyl, ethylenecarbonyl and isopropylenecarbonyl), amido groups, aminocarbonyl groups, trihalomethyl groups, perfluoroalkyl groups, formyl, mercapto and substituted or unsubstituted heterocyclic groups having 5 to 14 atoms in the ring that includes one or more nitrogen, sulfur, oxygen or selenium atoms with the remainder being carbon atoms (such as pyridyl, oxazolyl, thiophenyl, imidazolyl, and piperidinyl).

Preferably, when $R_4$ is a substituted alkylenephenyl group it contains 1 to 5 substituents (more preferably 1 or 2 substituents) on the phenyl moiety, which substituents are either halo groups, substituted or unsubstituted methyl or ethyl groups, or substituted or unsubstituted methoxy or 2-ethoxy groups. More preferably, $R_4$ comprises 1 to 3 methyl, fluoro, chloro, bromo or methoxy groups, or any combination of these groups on either the alkylene or phenyl moiety.

The alkylene moiety of a substituted alkylenephenyl group $R_4$ can be linear or branched in nature and has from 1 to 3 carbon atoms (such as methylene, ethylene, n-propylene or isopropylene). Preferably, the alkylene moiety of $R_4$ has 1 or 2 carbon atoms and more preferably, it is methylene. The alkylene moiety can have as many substituents as there are available hydrogen atoms to be removed from a carbon atom. Useful alkylene substituents are the same as those described above in defining the phenyl substituents, but the most common substituents for the alkylene moiety are fluoro and alkoxy.

The use of a particular ammonium ion in which all of $R_1$-$R_3$ are 2-hydroxyethyl groups may result in less odor during imaging.

The Class IV polymers may be readily prepared using many conventional methods. Many carboxylic acid or anhydride-containing polymers are commercially available. Substituted benzyltrialkylammonium salts can be readily synthesized using preparative techniques that would be obvious to one skilled in the art. One convenient method involves the reaction of a substituted benzylamine with a desired alkyl halide, alkyl sulfonate ester or other alkyl-containing compound having a suitable "leaving" group. Another useful method involves the reaction of a substituted benzylic halide with a trialkylamine.

The carboxylic acid or anhydride-containing polymers can be converted to a desired quaternary ammonium carboxylate salts by a variety of methods including, but not necessarily limited to:

a) the reaction of a carboxylic acid or acid anhydride-containing polymer with the hydroxide salt of the desired quaternary ammonium ion;

b) the use of ion exchange resin containing the desired quaternary ammonium ion;

c) the addition of the desired ammonium ion to a solution of the carboxylic acid-containing polymer or a salt thereof followed by dialysis;

d) the addition of a volatile acid salt of the desired quaternary ammonium ion (such as an acetate or formate salt) to the carboxylic acid-containing polymer followed by evaporation of the volatile component upon drying;

e) electrochemical ion exchange techniques; and f) the polymerization of monomers containing the desired quaternary ammonium carboxylate units.

When a Class IV polymer is used in the imageable layer, it may be advantageous for the heat-sensitive ionomer to be crosslinked. Crosslinking can be achieved in a number of ways. Some suitable methods are described above. Ethylenically unsaturated polymerizable monomers having crosslinkable groups (or groups that can serve as attachment points for crosslinking additives) can be copolymerized with the other monomers as noted above. Such monomers include, but are not limited to, 3-(trimethylsilyl)propyl acrylate or methacrylate, cinnamoyl acrylate or methacrylate, N-methoxymethyl methacrylamide, N-aminopropylmethacrylamide hydrochloride, acrylic or methacrylic acid and hydroxyethyl methacrylate.

Most commonly, crosslinking is provided by the addition of an epoxy-containing resin to the polymer or by the reaction of a bisvinylsulfonyl compound with amine-containing units (such as N-aminopropylmethacrylamide) within the polymer.

Photothermal Conversion Material

The imageable layer comprises a photothermal conversion material. It is essential that the imageable layer includes one or more photothermal conversion materials that can absorb imaging radiation from an appropriate energy source (such as a laser), which is then converted into heat. Most suitably, the imaging radiation is in the infrared and/or near-infrared regions of the electromagnetic spectrum.

The photothermal conversion material is generally present in the imageable layer in an amount sufficient to provide an optical transmission density of at least 0.1, and more suitably at least 0.4, at the wavelength of the imaging radiation (for example, 830 nm or 1064 nm). The particular amount needed for this purpose can be readily determined by one skilled in the art, depending upon the specific material used. By way of example, the net amount of photothermal conversion material present in the imageable layer (based on dry weight) is generally at least 1 wt.-%, more suitably between about 10 wt.-% and about 30 wt.-%, and can be up to 40 wt.-% or more.

Carbonaceous materials, such as carbon black, are frequently employed as a photothermal conversion material for thermally imageable compositions. While carbon black is a highly suitable material because of its low cost and absorption of radiation throughout the infrared region of the electromagnetic spectrum, its use with heat-sensitive ionomers creates problems. For example, ordinary carbon black cannot easily be dispersed in water or the alcoholic solvents of choice, which causes difficulty in formulating a coating composition. Furthermore, ordinary carbon particulates, such as untreated carbon black, are incompatible with the highly ionic environment presented by the heat-sensitive ionomers employed in the practice of the present invention.

Previous approaches enabling the use of carbonaceous materials as a photothermal conversion material with heat-sensitive ionomers have been reported. In U.S. Pat. No. 6,399,268 to Fleming, et al. and corresponding International Publication WO 00/63025 of Fleming, et al., the use of polymer-grafted carbon as a photothermal conversion material is demonstrated. The polymer-grafted carbon comprises carbon particles covalently bonded to polymer chains, such as poly(alkylene oxide) chains. Polymer-grafted carbon is thought to provide steric stabilization to the carbon particles. The polymer-grafted carbon particles resist flocculation even in the presence of a highly ionic environment, such as in the presence of ammonium carboxylate-functionalized polymers. Imageable members prepared with such polymer-grafted carbon particle dispersions exhibit acceptable optical density and imaging speed (or "exposure speed"), but tend to exhibit poor background sensitivity, even with the use of hydrophilic polymeric chains such as poly(ethylene glycol).

The use of ionically stabilized carbon as a photothermal conversion material is also known. Special carbon black products that include ionic functionality are designed to be water-dispersible. Tonically stabilized carbon dispersions offer excellent background performance in switchable polymer plates. However, ionically stabilized carbon particles tend to agglomerate or flocculate due to chemical interactions in highly ionic environments, such as in the presence of ammonium carboxylate-functionalized polymers or organoonium polymers. Imageable members prepared with such ionically stabilized carbon dispersions exhibit low optical density and slow imaging speed.

As a solution to the aforementioned problems, the present invention employs, as a photothermal conversion material, carbonaceous particles having thereon both:

i) an organic moiety having a molecular weight in the range of about 120 Da to about 1000 Da and including an ionic or ionizable substituent having like charge as the ionomer; and ii) a group represented by the formula $$—X\text{-}[NIon]_p\text{-}R_{terminal}$$

wherein X represents an aromatic group or an alkyl group,

NIon represents a non-ionic, non-ionizable group, $R_{terminal}$ represents hydrogen, an aromatic group, an alkoxy group, or an alkyl group, and p is an integer from 1 to about 500. The combination of both ionic moieties and non-ionic groups on the modified carbonaceous particles allows for a stable dispersion of the particles in a suitable solvent. Imageable members made with the modified carbonaceous particles exhibit high optical density and fast imaging speed, while preserving good background performance. This photothermal conversion material is described further below.

The imageable layer may optionally include other photothermal conversion materials as are known in the art. Such optional photothermal conversion materials can be dyes, pigments, metals, metal oxides, metal sulfides, etc. or combinations thereof. Suitable dyes are reported, for instance, in U.S. Pat. No. 6,623,908 to Zheng, et al. Particular dyes of interest are "broad band" dyes, that is those that absorb over a wide band of the spectrum. Also, as indicated above, the imageable element may include a separate layer that is in thermal contact with the imageable layer and that optionally comprises an additional photothermal conversion material.

Functionalized Carbonaceous Particles

As mentioned above, the present invention employs, as a photothermal conversion material, carbonaceous particles having thereon both:

i) an organic moiety having a molecular weight in the range of about 120 Da to about 1000 Da and including an ionic or ionizable substituent having like charge as the ionomer; and ii) a group represented by the formula:

$$—X\text{-}[NIon]_p\text{-}R_{terminal}$$

wherein X represents an aromatic group or an alkyl group,

NIon represents a non-ionic, non-ionizable group, $R_{terminal}$ represents hydrogen, an aromatic group, an alkoxy group, or an alkyl group, and p is an integer from 1 to about 500.

As used herein, the term "carbonaceous" refers to a material that, prior to modification, contains a significant carbon content or consists essentially of carbon. In unmodified form, the carbonaceous material may contain other elements, such as metals, surface-bound oxygen, adsorbed materials, trace impurities, etc. but predominantly is carbon. As a general measure, at least about 80% by weight of the carbonaceous material (in unmodified form) will be carbon, and typically 90% or more of the carbonaceous material (in unmodified form) will be carbon.

For the practice of the present invention, ordinary (i.e., unmodified) carbonaceous particles can be modified to meet the parameters described herein. Typically, ordinary carbonaceous particles serve as a starting material, and are reacted with suitable reagents to provide desired functionality. Alternatively, certain commercially available functionalized carbonaceous particles may be suitably employed as starting material, and further treated to provide the desired functionality.

The mean particle size for the carbonaceous particles used as starting material can vary. Most commonly, the carbonaceous particles are larger than 0.1 μm and smaller than 1 μm. Particularly suitable particles are smaller than 0.5 μm. Carbonaceous particles suitable as starting material, such as carbon black, are widely available and need not be further described herein in detail.

Ordinary carbonaceous particles can be reacted with suitable reagents in an appropriate reaction medium to provide the modified carbonaceous particles. Suitable reactions are described, for example, in U.S. Pat. Nos. 6,336,965 and 6,478,863 to Johnson, et al., in U.S. Pat. No. 5,554,739 to Belmont, and U.S. Pat. No. 5,851,280 to Belmont, et al.

The modified carbonaceous particles can be prepared in a two-step process, whereby the desired functionalities are provided in a sequential manner. For example, the organic moiety including the ionic or ionizable substituent can be provided in a first reaction, and the group comprising the non-ionic, non-ionizable group can be provided in a second reaction. For the purposes of illustration, unmodified carbonaceous particles could be reacted as described by Example 13 reported in U.S. Pat. No. 6,336,965, followed by treatment as described in Example 8 of U.S. Pat. No. 6,336,965. A two-step process may also be suitably done in reverse order.

Alternatively, the modified carbonaceous particles can be prepared by a one-step process, whereby the desired functionalities are provided simultaneously. Example 12 reported in U.S. Pat. No. 6,336,965, for example, describes a one-step process suitable for preparing modified carbonaceous particles.

Following preparation, the modified carbonaceous particles can be used in a dispersed form in the reaction medium. Alternatively, the modified carbonaceous particles (or a dispersion) can be subsequently subjected to cleaning procedures (e.g., washing, filtration, dialysis, or centrifugation) in order to remove excess reactants. The modified carbonaceous particles can then be added to either aqueous or non-aqueous media to form a stable dispersion.

Dispersions of the modified carbonaceous particles may be further purified to remove impurities and other undesirable free species which can co-exist in the dispersion. Known techniques of ultrafiltration/diafiltration using a membrane or ion exchange may be used to purify the dispersion and remove a substantial amount of free ionic and unwanted species. Also suitable is an optional exchange of counterions whereby the counterions that form a part of the modified carbonaceous particles are exchanged or substituted with alternative counterions utilizing known ion exchange techniques such as ultrafiltration, reverse osmosis, ion exchange columns and the like.

Organic Moiety Having an Ionic or Ionizable Substituent

The carbonaceous particles include an organic moiety having a molecular weight in the range of about 120 Da to about 1000 Da and including an ionic or ionizable substituent having like charge as the ionomer. Smaller organic moieties having a molecular weight in the range of about 120 Da to about 200 Da may be especially suitable.

An ionic substituent may be an anionic substituent or a cationic substituent as necessary. An ionizable substituent is one which is capable of forming an ionic substituent in a suitable medium. An ionizable substituent may form an anion or a cation.

The phrase "having like charge" is used herein to indicate that the polarity of the charge on the ionic substituent (or the polarity that the ionizable substituent is capable of bearing) is the same as the polarity of the net charge on the ionomer. For example, where the net charge on the ionomer (exclusive of any accompanying counterions) is negative, then the charge on an ionic substituent should be negative also.

U.S. Pat. No. 5,554,739 to Belmont and U.S. Pat. No. 5,851,280 to Belmont, et al., each of which is incorporated by reference in its entirety, describe non-electrochemical methods for preparing carbonaceous material having an attached organic group or moiety. One reported method involves the reaction of a carbonaceous material (such as carbonaceous particles) with a diazonium salt in a protic medium. The diazonium salt may contain the organic moiety to be attached to the carbonaceous particles. A wide variety of organic moieties may be attached to carbonaceous particles in this manner. The organic moiety may be an aliphatic group, a cyclic organic group, or a moiety having an aliphatic portion and a cyclic portion, for example.

For the practice of the present invention, organic moieties having an ionic or ionizable substituent may be attached to carbon material by the methods reported in U.S. Pat. Nos. 5,554,739 and 5,851,280. The methods may be employed to attach an organic moiety having an anionic substituent or a cationic substituent, or an ionizable substituent.

Suitable ionic or ionizable substituents forming anions include, for example, substituents derived from organic acids. Such substituents may include acidic groups or salts of acidic groups. An acidic group having a pKa lower than 11, or a salt of an acidic group having a pKa lower than 11 may be suitable. As described herein, a pKa of an ionizable substituent or acidic group refers to the pKa of the organic moiety as a whole, not just the ionizable substituent or acidic group. More suitably, the aforementioned pKa values are lower than 10 and most suitably lower than 9. In practice, a pKa less than about 5 is most convenient.

One particularly suitable organic moiety containing an ionizable substituent forming an anion includes both an aromatic portion and at least one ionizable group having a pKa lower than 11. In one embodiment, the aromatic portion of such an organic moiety is directly attached to the carbonaceous particles. The aromatic portion may be further substituted or unsubstituted, for example, with alkyl groups. Suitable aromatic portions include, for example, a phenyl or a naphthyl group. Suitable ionizable groups include, for example, sulfonic acid groups, sulfinic acid groups, phosphonic acid groups, or carboxylic acid groups.

Some examples of suitable organic moieties having an ionizable substituent forming an anion include: a substituted or unsubstituted sulfophenyl group or a salt thereof; a substituted or unsubstituted (polysulfo)phenyl group or a salt thereof; a substituted or unsubstituted sulfonaphthyl group or a salt thereof; or a substituted or unsubstituted (polysulfo)naphthyl group or a salt thereof. Specific exemplary compounds suitable for use in the reported methods and having an ionizable substituent capable of forming an anion include p-sulfophenyl (p-sulfanilic acid), 4-hydroxy-3-sulfophenyl (2-hydroxy-5-amino-benzenesulfonic acid), and 2-sulfoethyl (2-aminoethanesulfonic acid).

Suitable ionic or ionizable substituents forming cations include, for example, substituents derived from organic amines. For example, amines may be protonated to form ammonium groups in acidic media. Most commonly, an organic moiety having an ionizable substituent forming cations has a pKb of less than 5.

Quaternary ammonium groups ($—NR_3^+$) and quaternary phosphonium groups ($—PR_3^+$) also represent examples of suitable cationic substituents. In one embodiment, the organic moiety contains an aromatic portion (such as a phenyl or a naphthyl group) and a quaternary ammonium or a quaternary phosphonium group. The aromatic portion of such an organic moiety may be directly attached to the carbonaceous particles. Quaternized cyclic amines, and even quaternized aromatic amines, can also be used as ionic substituents in the organic moiety. Thus, N-substituted pyridinium compounds, such as N-methyl-pyridyl, can be suitable.

Other methods for preparing carbonaceous material having an attached organic moiety including an ionic or ionizable substituent are known, some of which are discussed in the section of U.S. Pat. No. 5,851,280 entitled "Background of the Invention." In particular, electrochemical methods reported in International Publication WO 92/13983 of Pinson, et al. may be employed in preparing suitable carbonaceous particles for the practice of the present invention.

Carbonaceous particles comprising an organic moiety having an ionic or ionizable substituent may be prepared according to the methods indicated above. Alternatively, certain commercially available functionalized carbonaceous particles may be suitably employed. For example, CAB-O-JET anionic carbon dispersions, available from Cabot Corporation (Boston, Mass.), may be suitable.

CAB-O-JET 200 is a commercially available stabilized aqueous dispersion of carbon black particles (20% pigment; pH ~7). The mean particle size is reported to be ~0.13 μm. The dispersion is stabilized due to the presence of moieties having anionic sulfonate groups on the surface of the carbon particles. CAB-O-JET 200 is suitable as a starting material in preparing the carbonaceous particles useful in the present invention, but must be further treated to provide the non-ionic group described below.

CAB-O-JET 300 is a commercially available stabilized aqueous dispersion of carbon black particles (15% pigment; pH ~7). The mean particle size is reported to be ~0.13 μm. The dispersion is stabilized due to the presence of moieties having anionic carboxylate groups on the surface of the carbon particles. CAB-O-JET 300 is suitable as a starting material in preparing the carbonaceous particles useful in the present invention, but must be further treated to provide the non-ionic group described below.

CAB-O-JET IJX 144 is an aqueous dispersion of carbon black particles (15% pigment; pH 7). in water). The mean particle size is reported to be ~220 nm. The dispersion is maintained by the presence of quaternary amine groups providing surface positive charges. CAB-O-JET IJX 144 is suitable as a starting material in preparing the carbonaceous particles useful in the present invention, but must be further treated to provide the non-ionic group described below.

Non-Ionic and Non-Ionizable Group

The carbonaceous particles also include a group that is non-ionic and non-ionizable under ordinary conditions. The non-ionic and non-ionizable group may be covalently bound to the carbonaceous particles. Covalent bonding provides a more stable attachment of the group onto the particles, as compared to adsorption of, e.g., polymers, surfactants and the like.

The non-ionic group in some embodiments can be provided by a moiety represented by the formula —X-[NIon]$_p$-R$_{terminal}$. In this formula, X represents an aromatic or alkyl linking group, NIon represents a non-ionic, non-ionizable group, p is an integer from 1 to about 500, and R$_{terminal}$ represents a terminal hydrogen, aromatic group, alkoxy group, or alkyl group.

In the formula given above, X serves as a linking group that attaches the moiety to the carbonaceous particle. In some embodiments, an unsubstituted or substituted phenylene group or benzoate group of the form -[Ph-C(═O)—O—] (where Ph represents a phenylene group) is suitable as the linking group. The linking group X should generally be non-ionic and non-ionizable.

NIon represents at least one group that is non-ionic, and which generally is not aromatic. Examples of non-ionic groups which are not aromatic include, but are not limited to, groups having no apparent ionic charge such as polymers of ethylene oxide, propylene oxide, other alkylene oxides, carboxylic acid esters, glycols, alcohols, esters, alkanolamine-fatty acid condensates, silicones, isocyanates, alkylpyrrolidenes, and alkylpolyglycosides.

The non-ionic group is most commonly a ($C_1$-$C_{12}$) alkyl group, or a ($C_1$-$C_{12}$) alkylene oxide group. In some embodiments, the non-ionic group is a straight or branched alkylene oxide group comprising 1 to 3 carbons, including —($CH_2$—O—), —($CH_2CH_2$—O—), —($CH(CH_3)$—O—), —($CH_2CH_2CH_2$—O—), —($CH(CH_3)CH_2$—O—), —($CH_2CH(CH_3)$—O—), or substituted versions of any of the foregoing. In one embodiment, the non-ionic group is —($CH_2CH_2$—O—).

NIon in some embodiments may represent a constitutional unit in an oligomeric or polymeric chain, for example, when p>1. The oligomeric or polymeric chain may comprise from 2 to about 500 units. Most suitably, the oligomeric or polymeric chain will comprise about 5 to about 100 units. Each NIon need not be the same when p>1. In other words, —[NIon]$_p$— could represent a copolymeric chain, for example. The polymeric chain can be a thermoplastic polymeric chain or a thermosetting polymeric chain. Further, the polymeric chain can be any type of polymeric group, such as a random polymer, alternating polymer, graft polymer, block polymer.

Specific examples of polymeric chains include, but are not limited to, linear polymers such as polyethylene, poly (vinyl chloride), polyisobutylene, polystyrene, polycaprolactam (nylon), polyisoprene, and the like. Other general classes of suitable polymeric groups include polyamides, polyacrylamides, polycarbonates, polyesters, polyethers, (polyhydroxy)benzenes, polyimides, polymers containing sulfur (such as polysulfides, (polyphenylene) sulfide, and polysulfones), polyolefins, polymethylbenzenes, polystyrene and styrene copolymers (ABS included), acetal polymers, acrylic polymers, acrylonitrile polymers and copolymers, polyvinylidene chloride, polymers containing olefinic double bonds (such as polybutadiene, polydicyclopentadiene), polyolefin copolymers, polyphenylene oxides, poly (vinyl alcohols), polyurethanes, thermoplastic elastomers, and the like.

R$_{terminal}$ is a terminal group, and can be hydrogen, an aromatic group, an alkoxy group, or an alkyl group, including a substituted form of any of the preceding. In most instances, the terminal group is hydrogen or aliphatic alkyl group. The terminal group should generally be non-ionic and non-ionizable.

The linking group and/or non-ionic group may be substituted with one or more functional groups. Examples of functional groups include, but are not limited to, —R', —OR', —COR', —COOR', —OCOR', carboxylates, halogens, —CN, —NR'$_2$, —$SO_3H$, sulfonates, —$OSO_3$, —NR'(COR'), —CONR'$_2$, —$NO_2$, —$PO_3H_2$, phosphonates, phosphates, —N═NR', —SOR', $NSO_2R'$, wherein R' which can be the same or different, is independently hydrogen, branched or unbranched ($C_1$-$C_{20}$) substituted or unsubstituted, saturated or unsaturated hydrocarbon, e.g., alkyl, alkenyl, alkynyl, substituted or unsubstituted aryl, substituted or unsubstituted heteroaryl, substituted or unsubstituted alkyoaryl, or substituted or unsubstituted arylalkyl.

The aromatic group with respect to the linking group and/or the terminal group can be substituted or unsubstituted and can be, for instance, an aryl or heteroaryl group. The aromatic group can be substituted with any suitable group, such as one or more alkyl groups or aryl groups. Preferably, the aromatic group is a phenyl, naphthyl, anthracenyl, phenanthrenyl, biphenyl, pyridinyl, benzothiadiazolyl, or benzothiazolyl.

Examples of suitable alkyl groups with respect to the linking group and/or the terminal group include, but are not limited to, substituted or unsubstituted alkyl groups which may be branched or unbranched. The alkyl group can be substituted with one or more groups, such as aromatic groups. Typical examples of the alkyl group include, but are not limited to, ($C_1$-$C_{12}$) alkyl groups, such as methyl, ethyl, propyl, butyl, pentyl, or hexyl groups. Examples of suitable substituents on a substituted alkyl group include, but are not limited to, an ester group, an amide group, an ether group, a carboxyl group, an aryl group, an alkyl group, and the like.

A wide variety of methods of introducing specific functionalities onto the surface of carbonaceous materials are known in the art. Such methods include electrical discharge treatment, treatment with ultraviolet radiation, chemical oxidation, and through control of the pyrolytic conditions under which the carbonaceous material is produced. Numerous techniques have been reported for using introduced surface functionalities as points of attachment for the grafting of non-ionic groups. One common strategy includes the reaction of a carbonaceous particulate material containing a reactive surface group with a polymer or copolymer containing a specific chemical moiety known to react with such a reactive group. Alternatively, a polymerization reaction can be carried out in the presence of a carbonaceous particulate material that is surface-functionalized with chemical groups capable of initiating or terminating the polymerization.

U.S. Pat. Nos. 6,336,965 and 6,478,863 to Johnson, et al., each of which is incorporated by reference in its entirety, report modified pigments having attached non-ionic groups such as polymeric or alkylene oxide groups and methods of making the modified pigments. The polymeric or alkylene oxide groups may be of the form —X-$[NIon]_p$-$R_{terminal}$. The pigment may be a carbonaceous material. The modified pigment can be prepared by reacting the pigment with a diazonium salt in a protic reaction medium to attach at least one non-ionic group to the surface of the pigment. The diazonium salt can be generated in situ from a primary amine compound that comprises the aforementioned non-ionic group. Methods of obtaining a suitable primary amine compound are also described in U.S. Pat. Nos. 6,336,965 and 6,478,863.

Methods of Making an Imageable Member

Imageable compositions according to the present invention are generally formulated in and coated from water or water-miscible solvents including, but not limited to, water-miscible alcohols (for example, methanol, ethanol, isopropanol, 1-methoxy-2-propanol and n-propanol), tetrahydrofuran, acetonitrile and acetone. Water, methanol, ethanol and 1-methoxy-2-propanol are suitable, for example. Mixtures (such as a mixture of water and methanol) of these solvents can also be used if desired. Other conventional solvents, such as methylethyl ketone, may also be used, either alone or as a mixture.

The imageable composition can be prepared and mixed using conventional methods. In the imageable composition, the heat-sensitive ionomer is generally present in an amount of at least 1 wt.-% (including solvent), and more suitably at least 2 wt.-%. A practical upper limit of the amount of charged polymer in the composition is about 20 to 25 wt.-%, depending on the coating method employed. The amount of photothermal conversion material in the imageable composition is generally at least 0.1 wt.-% (including solvent), more suitably about 1 wt.-%, and can be up to 5 to 10 wt.-%.

The imageable composition may further include conventional additives such as coating aids, surfactants, etc. In some embodiments, the imageable composition includes a crosslinking agent, such as an epoxy resin.

The imageable composition can be applied to a support using any suitable equipment and procedure, such as spin coating, knife coating, gravure coating, dip coating or extrusion hopper coating. In addition, the composition can be sprayed onto a support, including a cylindrical support, using any suitable spraying means. The imageable composition can be dried to remove solvent, leaving an imageable layer on the support.

Methods of Imaging an Imageable Member

The imageable members of this invention can be of any useful form including, but not limited to, printing plates, printing cylinders, printing sleeves and printing tapes (including flexible printing webs), all of any suitable size or dimensions. Most commonly, the imageable members are printing plates or on-press cylinders.

During imaging, the imageable member of this invention is exposed to a suitable source of energy that generates or provides localized heating in the imageable layer, such as a focused infrared laser beam or a thermoresistive head. Typically the imageable member is imagewise exposed according to digital information supplied to an imaging device. Since the imaged member can be used on-press without post-imaging processing, a practitioner can achieve true “computer-to-press” imaging.

A laser used to expose the imageable member of this invention is most often a diode laser, because of the reliability and low maintenance of diode laser systems, but other lasers such as gas or solid state lasers may also be used. Suitable combinations of power, intensity and exposure time for laser imaging will be readily ascertainable by those skilled in the art. Specifications for lasers that emit in the near-infrared region, and suitable imaging configurations and devices are described in U.S. Pat. No. 5,339,737 to Lewis et al. The imageable member is typically sensitized so as to maximize responsiveness at the emitting wavelength of the laser. For sensitization using the photothermal conversion material described herein, the particle size of the carbonaceous particles may be selected to maximize absorption.

The imaging apparatus can operate on its own, functioning solely as a platesetter, or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum.

In the drum configuration, the requisite relative motion between an imaging device (such as laser beam) and the imageable member can be achieved by rotating the drum (and the imageable member mounted thereon) about its axis, and moving the imaging device parallel to the rotation axis, thereby scanning the imageable member circumferentially so the image “grows” in the axial direction. Alternatively, the beam can be moved parallel to the drum axis and, after each pass across the imageable member, increment angularly so that the image "grows" circumferentially. In both cases, after a complete scan by the laser beam, an image corresponding to the original document or picture can be applied to the surface of the imageable member.

In the flatbed configuration, a laser beam is drawn across either axis of the imageable member, and is indexed along the other axis after each pass. Obviously, the requisite relative motion can be produced by moving the imageable member rather than the laser beam.

While laser imaging is most commonly employed in the practice of this invention, imaging can be provided by any other means that provides or generates thermal energy in an imagewise fashion. For example, imaging can be accomplished using a thermoresistive head (thermal printing head) in what is known as "thermal printing," described for example in U.S. Pat. No. 5,488,025 to Martin et al. Thermal printing heads are commercially available.

Following imaging, the imaged member can be used for printing without conventional wet processing. Ink applied to the imaged member can be imagewise transferred to a suitable receiving medium (such as cloth, paper, metal, glass or plastic) to provide one or more desired impressions. If desired, an intermediate blanket roller can be used to transfer the ink from the imaged member to the receiving medium. The imaged member can be cleaned between impressions, if desired, using conventional cleaning means.

This invention may take on various modifications and alterations without departing from the spirit and scope thereof. Accordingly, it is to be understood that this invention is not to be limited to the above-described, but it is to be controlled by the following claims. In describing preferred embodiments of the invention, specific terminology is used for the sake of clarity. The invention, however, is not intended to be limited to the specific terms so selected, and it is to be understood that each term so selected includes all technical equivalents that operate similarly.

EXAMPLES

Materials Preparation

Preparation of Functionalized Polymer

A polymer containing a primary amine group was prepared for subsequent reaction with a carbonaceous particulate material. A suitable aminophenyl poly(ethylene) glycol benzoate ester ("APEG") was prepared as needed, using an appropriate poly(ethylene glycol) methyl ether and 4-nitrobenzoyl chloride as starting material. APEG can be prepared according to the technique described in Example 11 of U.S. Pat. No. 6,336,965 (with reference to Example 7 therein).

Briefly, 4-nitrobenzoyl chloride can be reacted with the appropriate poly(ethylene glycol) methyl ether in a mixture of triethylamine in toluene to form a 4-nitrobenzoate poly (ethylene glycol) monomethyl ether ester, which is separated by filtration, washed, and dried by evaporation. The 4-nitrobenzoate poly(ethylene glycol) monomethyl ether ester is then reduced in the presence of a platinum oxide catalyst to form a 4-aminobenzoate poly(ethylene glycol) monomethyl ether ester.

Carbon Dispersion A

Carbon Dispersion A is an aqueous dispersion (10.25% solids in water) of carbon particles having phenylsulfonate and poly(ethylene glycol)benzoate groups thereon. The poly (ethylene glycol) portion of the poly(ethylene glycol)benzoate groups are characterized by a number average molecular weight of about 1100.

Carbon Dispersion A was prepared using CAB-O-JET 200 from Cabot Corporation (Boston, Mass.), as a starting material. CAB-O-JET 200 is an aqueous dispersion of carbon black (20% pigment; pH ~7) having moieties comprising anionic sulfonate groups on the surface of the carbon particles.

CAB-O-JET 200 was reacted with a suitable APEG (in excess) as described in Example 12 of U.S. Pat. No. 6,336,965, except that no 4-aminobenzoic acid was used. Briefly, the suitable APEG can be reacted with CAB-O-JET 200 dispersion by the addition of hydrochloric acid followed by sodium nitrite. Salt by-products and unreacted starting materials were removed by dialysis with water.

Carbon Dispersion B

Carbon Dispersion B is an aqueous dispersion (10.1% solids in water) of carbon particles having phenylsulfonate and poly(ethylene glycol)benzoate groups thereon. The poly (ethylene glycol) portion of the poly(ethylene glycol)benzoate groups are characterized by a number average molecular weight of about 2000.

Carbon Dispersion B was prepared in the same manner as Carbon Dispersion A, substituting an appropriate APEG.

Carbon Dispersion C

Carbon Dispersion C is an aqueous dispersion (7.5% solids in water) of carbon particles having phenylsulfonate and poly(ethylene glycol)benzoate groups thereon. The poly (ethylene glycol) portion of the poly(ethylene glycol)benzoate groups are characterized by a number average molecular weight of about 5000.

Carbon Dispersion C was prepared in the same manner as Carbon Dispersion A, substituting an appropriate APEG.

Carbon Dispersion D

Carbon Dispersion D is an aqueous dispersion (9.3% solids in water) of carbon particles having phenylsulfonate and poly(ethylene glycol)benzoate groups thereon. The poly (ethylene glycol) portion of the poly(ethylene glycol)benzoate groups are characterized by a number average molecular weight of about 1100; i.e., the same as for Carbon Dispersion A.

Carbon Dispersion D was prepared with functionalization taking place in reverse order as compared to Carbon Dispersions A-C. That is, ordinary carbon particles were first grafted with poly(ethylene glycol)benzoate groups, and then further functionalized with phenylsulfonate groups.

Comparative Examples 1 and 2

Examples 3 and 4

Coating formulations were prepared for Comparative Examples 1 and 2, and Examples 3 and 4, as specified in Table 1.

TABLE 1

Formulations for Comparative Examples 1 and 2, and Examples 3 and 4.

| Ingredient | Comparative Example 1 | Comparative Example 2 | Example 3 | Example 4 |
|---|---|---|---|---|
| [1]Poly(acrylic acid) | 0.614 g | 0.614 g | 0.614 g | 0.614 g |
| [2]Ammonium ion A | 12.384 g | 12.384 g | 12.381 g | 12.381 g |
| [3]CAB-O-JET 200 | 3.825 g | — | — | — |

TABLE 1-continued

Formulations for Comparative Examples 1 and 2, and Examples 3 and 4.

| Ingredient | Comparative Example 1 | Comparative Example 2 | Example 3 | Example 4 |
|---|---|---|---|---|
| [4]FX-GE-003 | — | 2.550 g | — | — |
| [5]Carbon Dispersion A | — | — | 3.731 g | 7.462 g |
| [6]CR-5L | 0.255 g | 0.255 g | 0.255 g | 0.255 g |
| [7]LODYNE 103A | 0.004 g | 0.004 g | 0.004 g | 0.004 g |
| n-Propyl alcohol | 9.631 g | 7.501 g | 9.668 g | 9.631 g |
| Water | 73.287 g | 76.692 g | 73.347 g | 69.653 g |

[1]Poly(acrylic acid) is PLASTICRYL HV-11 from Eastman Chemical (Kingsport, Tennessee), supplied as a 25% solution in water and characterized by a viscosity of 1700–2500 cP. Quantities indicated in the tables refer to the solid fraction only; the water fraction is included in the entries for "Water."
[2]Ammonium ion A is a 16.6% aqueous solution of N,N-bis(hydroxyethyl)-N-methyl-N-(2-methylbenzyl)ammonium hydroxide.
[3]CAB-O-JET 200 is an ionically stabilized aqueous carbon dispersion (20% solids) available from Cabot Corporation (Boston, Massachusetts).
[4]FX-GE-003 is an ethanolic dispersion (15% solids) of poly(ethylene glycol)-grafted carbon obtained from Nippon Shokubai (Osaka, Japan).
[5]Carbon Dispersion A is an aqueous dispersion (10.25% solids) of carbon particles having phenylsulfonate and poly(ethylene glycol)benzoate groups thereon.
[6]CR-5L is an epoxy resin available from Esprix Technologies (Sarasota, Florida).
[7]LODYNE 103A is a fluorocarbon surfactant available from Ciba Specialty Chemicals (Tarrytown, New York).

Each formulation was coated onto a grained, anodized aluminum substrate to obtain a dry coating weight of 1.6 g/m$^2$, yielding an imageable member. Imageable members of Examples 3 and 4 were imaged on a Creo 3230 TRENDSETTER from Creo Corporation (Burnaby, British Columbia) operating from 63 to 237 rpm at a laser power of 10 W, corresponding to exposure energies of 375-100 mJ/cm$^2$. The optical densities and imaging speeds of the coatings were measured, and are recorded in Table 2. Imaged plates were mounted on a Komori SPRINT 26 printing press and produced at least 1700 good quality prints.

TABLE 2

Optical densities and imaging speeds.

| | Comparative Example 1 | Comparative Example 2 | Example 3 | Example 4 |
|---|---|---|---|---|
| Optical density | 1.11 | 1.26 | 1.49 | 1.72 |
| Speed (mJ/cm$^2$) | 265 | 295 | 220 | 141 |

Example 5

A coating formulation was prepared as specified in Table 3.

TABLE 3

Formulation for Example 5.

| Ingredient | Example 5 |
|---|---|
| Poly(acrylic acid) | 0.614 g |
| [1]Ammonium ion B | 9.681 g |
| [2]Carbon Dispersion B | 7.574 g |
| CR-5L | 0.255 g |
| LODYNE 103A | 0.004 g |
| n-Propyl alcohol | 1.898 g |
| Water | 79.974 g |

[1]Ammonium ion B is a 20% methanolic solution of N-benzyl-N,N-bis(hydroxyethyl)-N-methylammonium hydroxide.
[2]Carbon Dispersion B is an aqueous dispersion (10.1% solids) of carbon particles having phenylsulfonate and poly(ethylene glycol)benzoate groups thereon.

The formulation was coated onto a grained, anodized aluminum substrate to obtain a dry coating weight of 1.5 g/m$^2$, yielding an imageable member. The optical density of the coating was 1.49.

The imageable member was imaged using laser radiation of 830 nm on a Creo 3230 TRENDSETTER at 142, 118, 101 and 89 rpm and 15 W, corresponding to 250, 300, 350 and 400 mJ/cm$^2$. The imaged plate was mounted on a Komori SPRINT 26 printing press and made at least 3700 good quality prints at all exposures.

Example 6

A coating formulation was prepared as specified in Table 4.

TABLE 4

Formulation for Example 6.

| Ingredient | Example 6 |
|---|---|
| Poly(acrylic acid) | 0.614 g |
| Ammonium ion B | 9.681 g |
| [1]Carbon Dispersion C | 10.200 g |
| CR-5L | 0.255 g |
| LODYNE 103A | 0.004 g |
| n-Propyl alcohol | 1.898 g |
| Water | 77.349 g |

[1]Carbon Dispersion C is an aqueous dispersion (7.5% solids) of carbon particles having phenylsulfonate and poly(ethylene glycol)benzoate groups thereon.

The formulation was coated onto a grained, anodized aluminum substrate to obtain a dry coating weight of 1.5 g/m$^2$, yielding an imageable member. The optical density of the coating was 1.29. The imageable member was imaged on a Creo 3230 TRENDSETTER at 89 rpm and 15 W, corresponding to 400 mJ/cm$^2$. The plate was mounted on a Komori SPRINT 26 printing press and made at least 20,000 good quality prints.

Example 7

A coating formulation was prepared as specified in Table 5.

TABLE 5

Formulation for Example 7.

| Ingredient | Example 7 |
|---|---|
| Poly(acrylic acid) | 0.614 g |
| Ammonium ion B | 9.681 g |
| [1]Carbon Dispersion D | 8.226 g |
| CR-5L | 0.255 g |
| LODYNE 103A | 0.004 g |

TABLE 5-continued

| Formulation for Example 7. | |
|---|---|
| Ingredient | Example 7 |
| n-Propyl alcohol | 1.898 g |
| Water | 79.323 g |

[1]Carbon Dispersion D is an aqueous dispersion (9.3% solids) of carbon particles having phenylsulfonate and poly(ethylene glycol)benzoate groups thereon.

The formulation was coated onto a grained, anodized aluminum substrate to obtain a dry coating weight of 1.5 g/m$^2$, yielding an imageable member. The optical density of the coating was 1.22. The imageable member was imaged on a Creo 3230 TRENDSETTER at 89 rpm and 15 W, corresponding to 400 mJ/cm$^2$, to yield a printing plate. The plate was mounted on a Komori SPRINT 26 printing press and made at least 20,000 good quality prints.

Comparative Example 8

A coating formulation was prepared as specified in Table 6.

TABLE 6

| Formulation for Comparative Example 8. | |
|---|---|
| Ingredient | Comparative Example 8 |
| Poly(acrylic acid) | 0.614 g |
| [1]Ammonium ion C | 3.564 g |
| FX-GE-003 | 2.040 g |
| CR-5L | 0.204 g |
| LODYNE 103A | 0.003 g |
| n-Propyl alcohol | 8.011 g |
| Water | 85.564 g |

[1]Ammonium ion C is a 40% aqueous solution of benzyltrimethylammonium hydroxide.

The formulation was coated onto a grained, anodized aluminum substrate to obtain a dry coating weight of 1.5 g/m$^2$, yielding an imageable member. The imageable member was imaged on a Creo 3230 TRENDSETTER at 80 rpm and 15 W (500 mJ/cm$^2$). The resulting plate was mounted on a Komori SPRINT 26 press charged with GRAPHIC EQUINOX black ink and with a fountain solution made up of Vam 142 W and Vam PAR each dosed at 3 oz/gal. Prints started exhibiting faint background sensitivity after only 3000 impressions.

Example 9

An imageable member prepared as described for Example 4 was imaged at 101 rpm and 12.75 W (300 mJ/cm$^2$). The resulting plate was used to print 20,000 impressions under the same conditions as for Comparative Example 8. The prints were free of background sensitivity through the entire print run.

What is claimed is:

1. An imageable member comprising a support and an imageable layer on the support, the imageable layer being rendered more hydrophobic or oleophilic upon thermal imaging, is capable of providing an image without wet processing, and comprises:

a) a heat-sensitive ionomer having a net positive or negative charge; and b) a photothermal conversion material comprising carbonaceous particles having thereon both i) an organic moiety having a molecular weight in the range of about 120 Da to about 1000 Da and including an ionic or ionizable substituent having like charge as the ionomer, and ii) a group represented by the formula $$—X\text{-}[NIon]_p\text{-}R_{terminal}$$

wherein X represents an aromatic group or an alkyl group,

NIon represents a non-ionic, non-ionizable group, $R_{terminal}$ represents hydrogen, an aromatic group, an alkoxy group, or an alkyl group, and p is an integer from 1 to about 500.

2. The imageable member of claim 1, wherein the ionomer is a macromolecular polyelectrolyte.

3. The imageable member of claim 1, wherein the ionomer is a copolymer derived from a polymerizable acrylate monomer.

4. The imageable member of claim 1, wherein the ionomer is an anionic polymer having a backbone including constitutional units having carboxylate groups linked directly or indirectly to the polymer backbone.

5. The imageable member of claim 4, wherein the ionomer is represented by the structure:

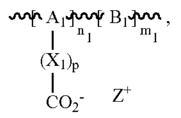

wherein $A_1$ represents constitutional units derived from ethylenically unsaturated polymerizable monomers;

$X_1$ represents a divalent linking group;

$Z^+$ represents a cation;

$B_1$ represents non-carboxylated constitutional units;

p is 0 or 1;

$m_1$ is 0 to 75 mol-%; and $n_1$ is from 25 to 100 mol-%.

6. The imageable member of claim 4, further comprising a quaternary ammonium counterion for the ionomer.

7. The imageable member of claim 6, wherein the quaternary ammonium counterion includes at least one unsubstituted or substituted phenyl moiety bonded directly or via a ($C_1$-$C_3$) alkylene to a quaternary nitrogen.

8. The imageable member of claim 1, wherein the ionomer is a crosslinked vinyl polymer having in at least 15 mol-% of its constitutional units a positively charged, pendant N-alkylated aromatic heterocyclic group.

9. The imageable member of claim 8, wherein the N-alkylated aromatic heterocyclic group is an imidazolium or pyridinium group.

10. The imageable member of claim 8, wherein the ionomer is represented by the structure:

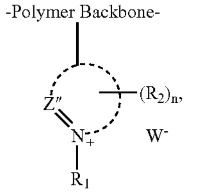

wherein $R_1$ represents an alkyl group;

$R_2$ represents an alkyl group, an alkoxy group, an aryl group, an alkenyl group, halo, a cycloalkyl group, or a heterocyclic group having 5 to 8 atoms in the ring;

Z" represents carbon, nitrogen, oxygen, or sulfur atoms necessary to complete an aromatic N-heterocyclic ring having 5 to 10 atoms in the ring;

n is 0 to 6; and $W^-$ represents an anion.

11. The imageable member of claim 8, wherein the ionomer is represented by the structure:

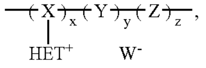

wherein $HET^+$ represents a positively charged, pendant N-alkylated aromatic heterocyclic group;

X represents constitutional units having attached $HET^+$ groups;

Y represents constitutional units derived from ethylenically unsaturated polymerizable monomers that provide crosslinking sites;

Z represents constitutional units derived from additional ethylenically unsaturated polymerizable monomers;

x is from 15 to 100 mol-%;

y is from 0 to 20 mol-%;

z is from 0 to 85 mol-%; and $W^-$ represents an anion.

12. The imageable member of claim 1, wherein the ionomer is a crosslinked vinyl polymer having in at least 15 mol-% of its constitutional units a positively charged, pendant organoonium group.

13. The imageable member of claim 12, wherein the ionomer is represented by one of the following structures:

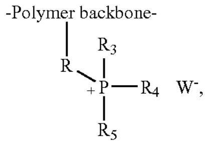

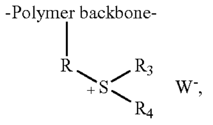

or

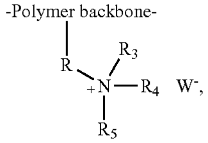

wherein R represents an alkylene, arylene, or cycloalkylene group or a combination of two or more such groups;

$R_3$, $R_4$ and $R_5$ independently represent substituted or unsubstituted alkyl, aryl or cycloalkyl groups, or any two of $R_3$, $R_4$ and $R_5$ can be combined to form a heterocyclic ring with the charged phosphorus, nitrogen or sulfur atom; and $W^-$ represents an anion.

14. The imageable member of claim 1, wherein the ionomer is represented by the structure:

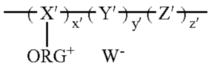

wherein $ORG^+$ represents an organoonium group;

X' represents constitutional units having attached $ORG^+$ groups;

Y' represents constitutional units derived from ethylenically unsaturated polymerizable monomers that provide crosslinking sites;

Z' represents constitutional units derived from additional ethylenically unsaturated polymerizable monomers;

$W^-$ represents an anion;

x' is from 15 to 99 mol-%;

y' is from 1 to 20 mol-%; and z' is from 0 to 84 mol-%.

15. The imageable member of claim 1, wherein the ionomer is a charged polymer having in at least 15 mol-% of its constitutional units a negatively-charged, pendant thiosulfate group.

16. The imageable member of claim 15, wherein the ionomer is represented by the structure:

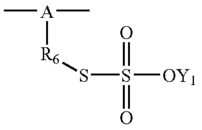

wherein A represents a polymeric backbone;

$R_6$ represents a divalent linking group; and $Y_1$ represents a hydrogen or a cation.

17. The imageable member of claim 1, wherein the organic moiety has a molecular weight in the range of about 120 Da to about 200 Da.

18. The imageable member of claim 1, wherein the organic moiety includes an ionic substituent having like charge as the ionomer.

19. The imageable member of claim 18, wherein the organic moiety is a phenyl or naphthyl group including the ionic substituent.

20. The imageable member of claim 18, wherein the ionic substituent is a sulfonate, carboxylate, or phosphate group.

21. The imageable member of claim 18, wherein the ionic substituent is an ammonium or phosphonium group.

22. The imageable member of claim 18, wherein the ionic substituent is a quaternary ammonium group.

23. The imageable member of claim 1, wherein X is covalently bound to the carbonaceous particle.

24. The imageable member of claim 1, wherein X represents a phenylene group.

25. The imageable member of claim 1 wherein X represents a benzoate group represented by -[Ph-C(=O)—O—], wherein Ph represents a phenylene group.

26. The imageable member of claim 1, wherein NIon represents an alkylene oxide group comprising from 1 to about 12 carbons.

27. The imageable member of claim 1, wherein NIon represents a straight or branched alkylene oxide group comprising 1 to 3 carbons.

28. The imageable member of claim 1, wherein NIon represents a $—(CH_2)_2—O—)$ group.

29. The imageable member of claim 1, wherein $R_{terminal}$ represents hydrogen or an aliphatic alkyl group.

30. The imageable member of claim 1, wherein p is an integer from about 5 to about 100.

31. The imageable member of claim 1, wherein:

X represents a benzoate group represented by -[Ph-C(=O)—O—], wherein Ph represents a phenylene group;

NIon represents a straight or branched alkylene oxide group comprising 1 to 3 carbons;

$R_{terminal}$ represents hydrogen or an aliphatic alkyl group; and p is an integer from about 5 to about 100.

32. An imageable member comprising a support and an imageable layer on the support, the imageable layer being rendered more hydrophobic or oleophilic upon thermal imaging, is capable of providing an image without wet processing, and consists essentially of:

a) a hydrophilic heat-sensitive polymeric salt having:

i) an anionic polymer having a backbone including repeating units having carboxylate groups linked directly or indirectly to the polymer backbone; and ii) a quaternary ammonium counterion having at least one quaternary nitrogen; and b) a photothermal conversion material comprising carbonaceous particles having thereon both i) an organic moiety having a molecular weight in the range of about 120 Da to about 1000 Da including an anionic substituent, and ii) an aromatic or alkyl group substituted with at least one poly(alkylene oxide) group, wherein each alkylene oxide unit of the poly(alkylene oxide) group comprises from 1 to about 12 carbons.

33. The imageable member of claim 32, wherein the anionic polymer is a copolymer derived from a polymerizable acrylate monomer.

34. The imageable member of claim 32, wherein the quaternary ammonium counterion includes at least one unsubstituted or substituted phenyl or benzyl moiety bonded directly or via a $(C_1-C_3)$ alkylene to the quaternary nitrogen.

35. The imageable member of claim 34, wherein the substituted phenyl or benzyl moiety includes at least one substituent selected from halo, methyl, ethyl, methoxy, and 2-ethoxy.

36. The imageable member of claim 32, wherein at least one $(C_1-C_3)$ hydroxyalkyl group is bonded to the quaternary nitrogen.

37. The imageable member of claim 32, wherein at least one hydroxyethyl group is bonded to the quaternary nitrogen.

38. The imageable member of claim 32, wherein the quaternary ammonium counterion is multi-cationic and includes at least two quaternary nitrogens.

39. The imageable member of claim 32, wherein the quaternary nitrogen is a member of a 5- to 14-atom heterocyclic ring.

40. The imageable member of claim 39, wherein the quaternary nitrogen is at the vertex of two intersecting heterocyclic rings.

41. The imageable member of claim 32, wherein the organic moiety has a molecular weight in the range of about 120 Da to about 200 Da.

42. The imageable member of claim 32, wherein the organic moiety is an aromatic group.

43. The imageable member of claim 32, wherein the organic moiety is a phenyl or naphthyl group including the anionic substituent.

44. The imageable member of claim 32, wherein the anionic substituent is a sulfonate group.

45. The imageable member of claim 32, wherein the aromatic or alkyl group is covalently bound to the carbonaceous particle.

46. The imageable member of claim 32, wherein the aromatic group is a phenylene group.

47. The imageable member of claim 32, wherein the aromatic group is a benzoate group represented by -[Ph-C(=O)—O—], wherein Ph represents a phenylene group.

48. The imageable member of claim 32, wherein the poly(alkylene oxide) group is represented by $$—[(CH_2)_m—O—)]_pR,$$

wherein m is an integer from 1 to 12;

p is an integer from 1 to 500; and

R represents hydrogen, a substituted or unsubstituted alkyl group, or a substituted or unsubstituted aromatic group.

49. The imageable member of claim 32, wherein the poly(alkylene oxide) group consists of straight or branched alkylene oxide units comprising 1 to 3 carbons.

50. The imageable member of claim 32, wherein the poly(alkylene oxide) group consists of alkylene oxide units represented by $—(CH_2)_2—O—)$.

51. In an imageable member having an imageable layer being rendered more hydrophobic or oleophilic upon thermal imaging, is capable of providing an image without wet processing, and comprises:

a heat-switchable ionomer characterized by a net positive or negative charge; and photothermal conversion material;

the improvement comprising:

as a photothermal conversion material, carbonaceous particles having thereon both i) an organic moiety having a molecular weight in the range of about 120 Da to about 1000 Da and including an ionic substituent having like charge as the ionomer, and ii) a group represented by the formula $$—X\text{-}[NIon]_p\text{-}R_{terminal}$$

wherein X represents an aromatic group or an alkyl group,

NIon represents a non-ionic, non-ionizable group, $R_{terminal}$ represents hydrogen, an aromatic group, an alkoxy group, or an alkyl group, and p is an integer from 1 to about 500.

52. The imageable member of claim 51, wherein the organic moiety has a molecular weight in the range of about 120 Da to about 200 Da.

53. The imageable member of claim 51, wherein the organic moiety includes an ionic substituent having like charge as the ionomer.

54. The imageable member of claim 53, wherein the organic moiety is a phenyl or naphthyl group including the ionic substituent.

55. The imageable member of claim 53, wherein the ionic substituent is a sulfonate, carboxylate, or phosphonate group.

56. The imageable member of claim 53, wherein the ionic substituent is an ammonium or phosphonium group.

57. The imageable member of claim 53, wherein the ionic substituent is a quaternary ammonium group.

58. The imageable member of claim 51, wherein X is covalently bound to the carbonaceous particle.

59. The imageable member of claim 51, wherein X represents a phenylene group.

60. The imageable member of claim 51, wherein X represents a benzoate group represented by -[Ph-C(═O)—O—], wherein Ph represents a phenylene group.

61. The imageable member of claim 51, wherein NIon represents an alkylene oxide group comprising from 1 to about 12 carbons.

62. The imageable member of claim 51, wherein NIon represents a straight or branched alkylene oxide group comprising 1 to 3 carbons.

63. The imageable member of claim 51, wherein NIon represents a $—(CH_2)_2—O—)$ group.

64. The imageable member of claim 51, wherein $R_{terminal}$ represents hydrogen or an aliphatic alkyl group.

65. The imageable member of claim 51, wherein p is an integer from about 5 to about 100.

66. The imageable member of claim 51, wherein:

X represents a benzoate group represented by -[Ph-C(═O)—O—], wherein Ph represents a phenylene group;

NIon represents a straight or branched alkylene oxide group comprising 1 to 3 carbons;

$R_{terminal}$ represents hydrogen or an aliphatic alkyl group; and p is an integer from about 5 to about 100.

67. A method of providing a lithographic printing plate comprising imagewise exposing to thermal energy, an imageable member comprising a support and an imageable layer on the support, the imageable layer being rendered more hydrophobic or oleophilic upon thermal imaging, is capable of providing an image without wet processing, and comprises:

a) a heat-sensitive ionomer having a net positive or negative charge; and b) a photothermal conversion material comprising carbonaceous particles having thereon both i) an organic moiety having a molecular weight in the range of about 120 Da to about 1000 Da and including an ionic or ionizable substituent having like charge as the ionomer, and ii) a group represented by the formula $—X\text{-}[NIon]_p\text{-}R_{terminal}$ wherein X represents an aromatic group or an alkyl group, NIon represents a non-ionic, non-ionizable group, $R_{terminal}$ represents hydrogen, an aromatic group, an alkoxy group, or an alkyl group, and p is an integer from 1 to about 500, to provide a printing surface comprised of exposed and non-exposed regions in the imageable layer without wet processing.

68. The imageable member of claim 1 wherein said imageable layer is the only heat-sensitive imageable layer on said support.

* * * * *

UNITED STATES PATENT AND TRADEMARK OFFICE

CERTIFICATE OF CORRECTION

PATENT NO. : 7,250,245 B2
APPLICATION NO. : 10/852552
DATED : July 31, 2007
INVENTOR(S) : Paul R. West et al.

It is certified that error appears in the above-identified patent and that said Letters Patent is hereby corrected as shown below:

| | |
|---|---|
| Claim 20<br>Col. 34, line 53 | In Claim 20, delete "phosphate" and insert -- phosphonate --, therefor. |

Signed and Sealed this

Second Day of December, 2008

JON W. DUDAS
*Director of the United States Patent and Trademark Office*